United States Patent
Naka et al.

(10) Patent No.: US 8,378,459 B2
(45) Date of Patent: Feb. 19, 2013

(54) SEMICONDUCTOR DEVICE, SEMICONDUCTOR WAFER AND MANUFACTURING METHOD OF THE SAME

(75) Inventors: Yasuhiro Naka, Hitachinaka (JP); Naotaka Tanaka, Kasumigaura (JP); Toshihide Uematsu, Matsudo (JP); Chuichi Miyazaki, Akishima (JP); Kazunari Suzuki, Tokyo (JP); Yasuyuki Nakajima, Tachikawa (JP); Yoshiyuki Abe, Hinode (JP); Kenji Kohzu, Hitachinaka (JP); Kosuke Kitaichi, Higashimurayama (JP); Shinya Ogane, Fuchu (JP)

(73) Assignee: Renesas Electronics Corporation, Kanagawa (JP)

( * ) Notice: Subject to any disclaimer, the term of this patent is extended or adjusted under 35 U.S.C. 154(b) by 233 days.

(21) Appl. No.: 12/795,950

(22) Filed: Jun. 8, 2010

(65) Prior Publication Data

US 2010/0308442 A1 Dec. 9, 2010

(30) Foreign Application Priority Data

Jun. 9, 2009 (JP) ................................. 2009-137893

(51) Int. Cl.
*H01L 23/544* (2006.01)
(52) U.S. Cl. ................. 257/620; 257/737; 257/E23.064
(58) Field of Classification Search .................. 257/620, 257/737, E23.064
See application file for complete search history.

(56) References Cited

U.S. PATENT DOCUMENTS

| 2003/0060035 | A1 | 3/2003 | Kimura |
| 2003/0153172 | A1* | 8/2003 | Yajima et al. ................. 438/612 |
| 2007/0278678 | A1 | 12/2007 | Uchida |
| 2008/0006941 | A1* | 1/2008 | Cho et al. ........................ 257/737 |
| 2010/0025829 | A1* | 2/2010 | Mengel et al. ................. 257/676 |

FOREIGN PATENT DOCUMENTS

| JP | 2003-100801 | 4/2003 |
| JP | 2006-080284 | 3/2006 |

* cited by examiner

*Primary Examiner* — Tan N Tran
(74) *Attorney, Agent, or Firm* — Brundidge & Stanger, P.C.

(57) ABSTRACT

In a state where an adhesive tape is attached onto a main surface of a semiconductor wafer, a trench is formed in a rear surface of the semiconductor wafer. For forming the trench in the rear surface of the semiconductor wafer, after coating a resist film on the rear surface of the semiconductor wafer, the resist film is patterned by using the photolithography technology. The patterning of the resist film is performed so as not to leave the resist film in the region where the trench is to be formed. Then, the trench is formed in a predetermined region of the semiconductor wafer by the dry etching technology using the patterned resist film as a mask. Specifically, the trench is formed in the region near the dicing line.

8 Claims, 35 Drawing Sheets

------ MEASUREMENT POSITION

------- MEASUREMENT POSITION

----- MEASUREMENT POSITION

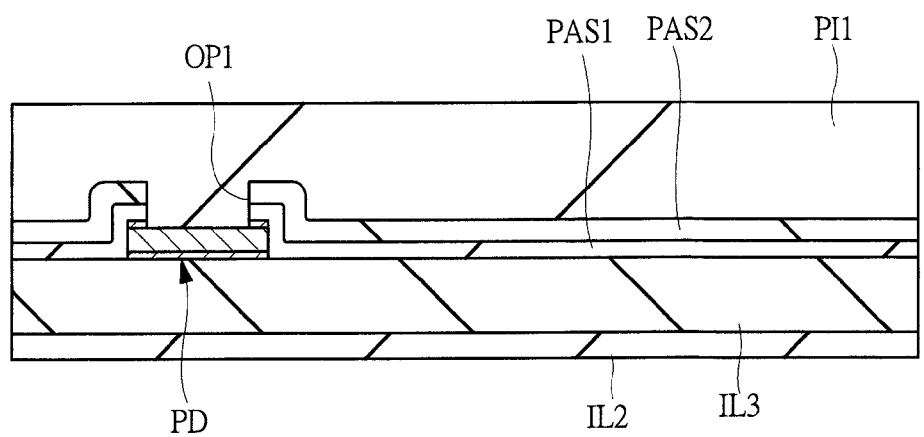
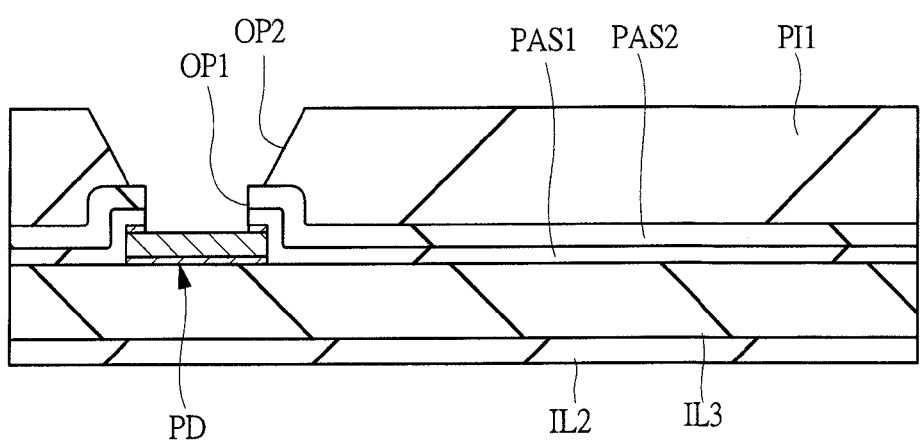

2a≦b<c

SEMICONDUCTOR DEVICE, SEMICONDUCTOR WAFER AND MANUFACTURING METHOD OF THE SAME

CROSS-REFERENCE TO RELATED APPLICATION

The present application claims priority from Japanese Patent Application No. 2009-137893 filed on Jun. 9, 2009, the content of which is hereby incorporated by reference into this application.

TECHNICAL FIELD OF THE INVENTION

The present invention relates to a semiconductor device, a semiconductor wafer and a manufacturing method of the same. More particularly, it relates to a technology effectively applied to a semiconductor device having a semiconductor chip on which bump electrodes are formed and to the manufacture thereof.

BACKGROUND OF THE INVENTION

Japanese Patent Application Laid-Open Publication No. 2006-80284 (Patent Document 1) discloses a structure having a chamfered portion provided in a peripheral region of a rear surface of a semiconductor chip. This chamfered portion is provided at about 45 degrees to the rear surface of the semiconductor chip. So, the Patent Document 1 says that the occurrence of edge chipping can be effectively suppressed.

Japanese Patent Application Laid-Open Publication No. 2003-100801 (Patent Document 2) discloses a semiconductor device having a flip-chip structure in which a semiconductor chip is electrically connected to a chip mounting member (wiring board) through functional bumps provided on the semiconductor chip. At this time, in the Patent Document 2, dummy bumps against the local flexure force of the semiconductor chip are interposed between the semiconductor chip and the chip mounting member.

SUMMARY OF THE INVENTION

A semiconductor chip in which semiconductor elements and multilayer wirings are formed is packaged afterward. In the packaging of a semiconductor chip, for example, a semiconductor chip is mounted on a wiring board, and pads formed on the semiconductor chip and terminals formed on the wiring board are connected by wires. Thereafter, resin is formed so as to cover the semiconductor chip to seal the semiconductor chip with this resin. Then, solder balls to be external connection terminals are formed on a surface on the reverse side of the chip mounting surface of the wiring board, thereby completing the packaging of the semiconductor chip.

In recent years, downsizing of a semiconductor device has been demanded, and to meet this demand, downsizing of the package of a semiconductor chip has been proceeding. For the downsizing of the package of the semiconductor chip, the flip-chip connection using bump electrodes instead of wires is employed for the connection between the semiconductor chip and the wiring board.

When the semiconductor chip and the wiring board are connected by wires, since pads formed on the semiconductor chip and terminals formed on the wiring board have to be kept apart by a predetermined distance and connected by wires, a wire connection region for the wire connection has to be secured. Meanwhile, in the case where protruding bump electrodes are formed on the semiconductor chip and these bump electrodes are connected to the terminals on the wiring board, since the bump electrodes and the terminals are directly in contact with each other, it is not necessary to secure the wire connection region, and the downsizing of the package can be achieved. Further, in comparison to the case where pads and terminals are connected by long wires, the parasitic resistance and the parasitic inductance of the wires can be reduced in the case where the bump electrodes and the terminals are directly connected, and therefore, the electrical characteristics can be advantageously improved.

Here, as another demand for the package, in addition to the downsizing of the package described above, thickness reduction of the package has also been demanded. For the achievement of the thickness reduction of the package, the thickness reduction of the semiconductor chip has been proceeding. In this case, there exist a process for reducing the thickness of the semiconductor wafer and a process for forming the bump electrodes in each chip region of the semiconductor wafer.

For example, in the case where the bump electrodes are formed in each chip region of the semiconductor wafer after thinly polishing the semiconductor wafer, particularly when the thickness of the semiconductor wafer is reduced, the semiconductor wafer is warped, and this warpage causes a problem of handling. As a result, it becomes difficult to form the bump electrodes in each chip region of the semiconductor wafer.

In this respect, however, the problem can be solved by attaching a special adhesive tape onto a bump electrode forming surface of the semiconductor wafer after forming the bump electrodes in each chip region of the semiconductor wafer and then polishing the rear surface of the semiconductor wafer. But the inventors of the present invention have found that a new problem is caused in the case where the rear surface of the semiconductor wafer is polished after the bump electrodes are formed in each chip region of the semiconductor wafer, particularly when the thickness of the semiconductor wafer is reduced as described above.

This new problem will be described. In the state where bump electrodes are present on a main surface (element forming surface) of a semiconductor wafer, when a rear surface on the reverse side of the main surface of the semiconductor wafer is polished, the main surface of the semiconductor wafer on which the bump electrodes have been formed is directed downward, and an adhesive tape is attached between the main surface and a stage to fix the semiconductor wafer. In this state, a grinder is pushed onto the rear surface of the semiconductor wafer directed upward to polish the rear surface of the semiconductor wafer.

In this case, since the polishing pressure becomes uneven due to the presence of the bump electrodes, the variation in thickness occurs in the semiconductor wafer. More specifically, in the main surface of the semiconductor wafer, the polishing pressure is increased in the region in which the bump electrodes are disposed densely, and therefore, the semiconductor wafer has the small thickness in the region in which the bump electrodes are disposed densely. On the other hand, the polishing pressure is decreased in the region in which the bump electrodes are disposed less densely (sparsely), and therefore, the semiconductor wafer has the large thickness in the region in which the bump electrodes are disposed less densely. As a result, when the rear surface of the semiconductor wafer is polished after forming the bump electrodes on the semiconductor wafer, the variation in thickness occurs in the regions of the semiconductor wafer depending on the density of the formed bump electrodes.

Next, there exists a process of acquiring semiconductor chips by cutting the semiconductor wafer into each chip region (dicing), and the case where the dicing process is performed in the state where there is the variation in thickness in the regions of the semiconductor wafer will be considered. In the dicing process, the semiconductor wafer is fixed to the stage by vacuum suction force, but if there is the variation in thickness in the regions of the semiconductor wafer, the stress distribution is generated in the semiconductor wafer depending on the variation in thickness. When the semiconductor wafer has a large thickness, the stress distribution does not cause any problem because of the rigidity of the semiconductor wafer, but when the thickness of the semiconductor wafer is reduced, cracks are formed in the semiconductor chip in the dicing cut due to the stress distribution generated in the semiconductor wafer.

An object of the present invention is to provide a technology capable of suppressing the occurrence of the cracks in the individual pieces of the semiconductor chips when the semiconductor wafer on which bump electrodes have been formed in each chip region is diced into the individual semiconductor chips.

The above and other objects and novel characteristics of the present invention will be apparent from the description of the present specification and the accompanying drawings.

The typical ones of the inventions disclosed in the present application will be briefly described as follows.

A semiconductor device according to a typical embodiment of the present invention comprises: a rectangular semiconductor chip, and the semiconductor chip includes: (a) a semiconductor substrate; and (b) a plurality of protruding bump electrodes formed on an element forming surface of the semiconductor substrate. The semiconductor chip has an edge region within a predetermined distance from an edge region of the semiconductor chip and an inner region other than the edge region. At this time, a thickness in the edge region of the semiconductor chip is smaller than a thickness in the inner region of the semiconductor chip.

Also, a semiconductor wafer according to a typical embodiment of the present invention comprises: a plurality of chip regions partitioned by dicing lines, and each of the plurality of chip regions includes: (a) a semiconductor substrate; and (b) a plurality of protruding bump electrodes formed on an element forming surface of the semiconductor substrate. Further, each of the plurality of chip regions has an edge region within a predetermined distance from the dicing line and an inner region other than the edge region. At this time, a thickness in the edge region of the individual chip region is smaller than a thickness in the inner region of the individual chip region.

Furthermore, a manufacturing method of a semiconductor device according to a typical embodiment of the present invention comprises the steps of: (a) preparing a semiconductor wafer including a plurality of chip regions partitioned by dicing lines, each of the plurality of chip regions having an edge region within a predetermined distance from the dicing line and an inner region other than the edge region; and (b) forming a plurality of bump electrodes on an element forming surface of the semiconductor wafer. Further, the method comprises the step of: (c) attaching an adhesive tape onto the element forming surface of the semiconductor wafer on which the plurality of bump electrodes have been formed, and then polishing a rear surface on a reverse side of the element forming surface of the semiconductor wafer placed on a stage, while pressing the element forming surface of the semiconductor wafer onto the stage via the adhesive tape. Next, the method comprises the step of: (d) after the step (c), etching the rear surface of the semiconductor wafer via a mask, thereby making a thickness in the edge region of an individual chip region smaller than a thickness in the inner region of the individual chip region. Thereafter, the method comprises the step of: (e) after the step (d), attaching a dicing tape onto the rear surface of the semiconductor wafer, and then cutting the semiconductor wafer along the dicing line while bringing the rear surface of the semiconductor wafer in contact with the stage via the dicing tape.

The effects obtained by typical embodiments of the invention disclosed in the present application will be briefly described below.

It is possible to suppress the occurrence of the cracks in the individual pieces of the semiconductor chips when the semiconductor wafer on which bump electrodes have been formed in each chip region is diced into the individual semiconductor chips.

BRIEF DESCRIPTIONS OF THE DRAWINGS

FIG. 20 is a cross-sectional view showing the manufacturing process of the semiconductor device continued from FIG. 19;

FIG. 21 is a cross-sectional view showing the manufacturing process of the semiconductor device continued from FIG. 20;

DESCRIPTIONS OF THE PREFERRED EMBODIMENTS

Figure 1:
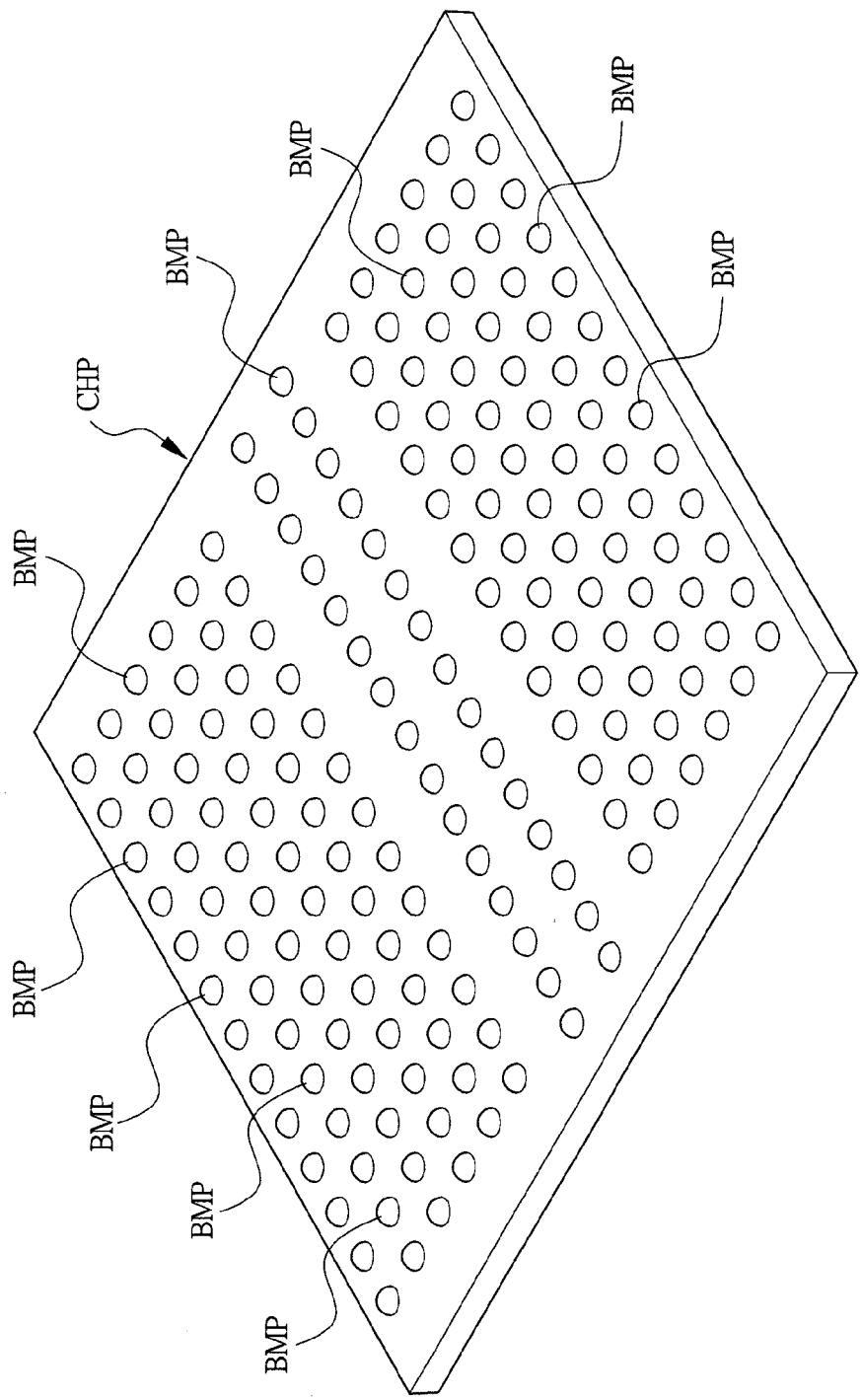
FIG. 1 is a perspective view showing the outward appearance of a semiconductor chip in the first embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols throughout the drawings for describing the embodiments, and the repetitive description thereof is omitted. Note that hatching is used even in a plan view so as to make the drawings easily understood.

First Embodiment

The present invention is a technical idea for a semiconductor device having a semiconductor chip on which bump electrodes are formed. Specifically, as described in the section of SUMMARY OF THE INVENTION, a semiconductor device having a semiconductor chip on which bump electrodes are formed includes, for example, a semiconductor device in which a semiconductor chip on which bump electrodes are formed is packaged by the flip-chip connection to a wiring board larger in size than the semiconductor chip. Further, some semiconductor devices having a semiconductor chip on which bump electrodes are formed employ a technology called wafer process package (WPP).

In the technology in which the packaging process (back-end process) and the wafer process (front-end process) are unified and the packaging is completed in a wafer state, that is, the so-called wafer process package (WPP), the wafer process is applied to perform up to the packaging process. This WPP technology has an advantage that the number of processes can be significantly reduced compared with the conventional method in which the packaging process is performed to each of the semiconductor chips cut out from the semiconductor wafer.

In the WPP technology, for example, the semiconductor device is manufactured through the processes shown below. First, semiconductor elements such as MISFET (Metal Insulator Semiconductor Field Effect Transistor) are formed on a main surface of a semiconductor wafer, and multiple wiring layers are formed on the semiconductor elements. Thereafter, a stacked film made up of a silicon nitride film and a silicon oxide film is formed on a top layer wiring formed in a top layer of the wiring layers. Then, this stacked film is patterned to form a pad in which a part of the top layer wiring is exposed.

Subsequently, after forming a polyimide resin film on the silicon oxide film, the silicon nitride film, the silicon oxide film and the polyimide resin film are patterned to form an opening, on the bottom surface of which the pad is exposed. Then, a thin electrode layer (seed layer) is formed on the polyimide resin film including the inside of the opening, and a rewiring is formed on this electrode layer by using a plating method. The rewiring is made up of, for example, a stacked film of a copper film and a nickel film, and the rewiring is electrically connected to the pad at one end thereof. Next, a polyimide resin film is formed on the rewiring and then patterned to expose the other end of the rewiring. Thereafter, a bump electrode is formed on the exposed other end of the rewiring. In this manner, the rewiring and the bump electrode connected the rewiring can be formed in a state of a semiconductor wafer. More specifically, the WPP technology can be applied to each of the product chip regions of the semiconductor wafer.

According to the WPP technology described above, the pads formed with a narrow pitch are connected to the bump electrodes arranged with a pitch wider than that of the pads through the rewiring. Therefore, according to the WPP technology, compared with the package structure in which the pads with a narrow pitch are connected to the wiring board by long wires, the parasitic resistance and the parasitic inductance due to the long wires can be reduced. As a result, according to the WPP technology, the electrical characteristics of the semiconductor device can be improved, and further, since the packaging is completed with the size of the semiconductor chip, the downsizing of the semiconductor device can be achieved.

As described above, the semiconductor device having a semiconductor chip on which bump electrodes are formed employs a packaging form in which the semiconductor chip is flip-chip connected to the wiring board larger in size than the semiconductor chip by the bump electrodes formed on the semiconductor chip or a packaging form in which the WPP technology is used to complete the packaging with the size equal to the semiconductor chip. The present invention can be applied to both of the packaging forms, but the technical idea of the present invention will be described below with taking the packaging form using the WPP technology as an example.

The semiconductor device in the first embodiment will be described with reference to the drawings. FIG. 1 is a perspective view showing the outward appearance of a semiconductor chip CHP in the first embodiment. In FIG. 1, the semiconductor chip CHP has a rectangular shape, and a plurality of bump electrodes BMP are formed on a main surface on the side of the element forming surface of the semiconductor chip CHP. The plurality of bump electrodes BMP are arranged in an array on the main surface of the semiconductor chip CHP. In the semiconductor chip CHP shown in FIG. 1, the bump electrodes BMP to be external connection terminals are directly formed on the main surface of the semiconductor chip CHP. More specifically, the semiconductor chip CHP in the first embodiment is packaged in a chip state. In other words, the so-called WPP (Wafer Process Package) technology is applied thereto. In this WPP technology, the wafer process is applied to perform up to the packaging process. This WPP technology has an advantage that the number of processes can be significantly reduced compared with the conventional method in which the packaging process is performed to each of the semiconductor chips cut out from the semiconductor wafer.

Figure 2:
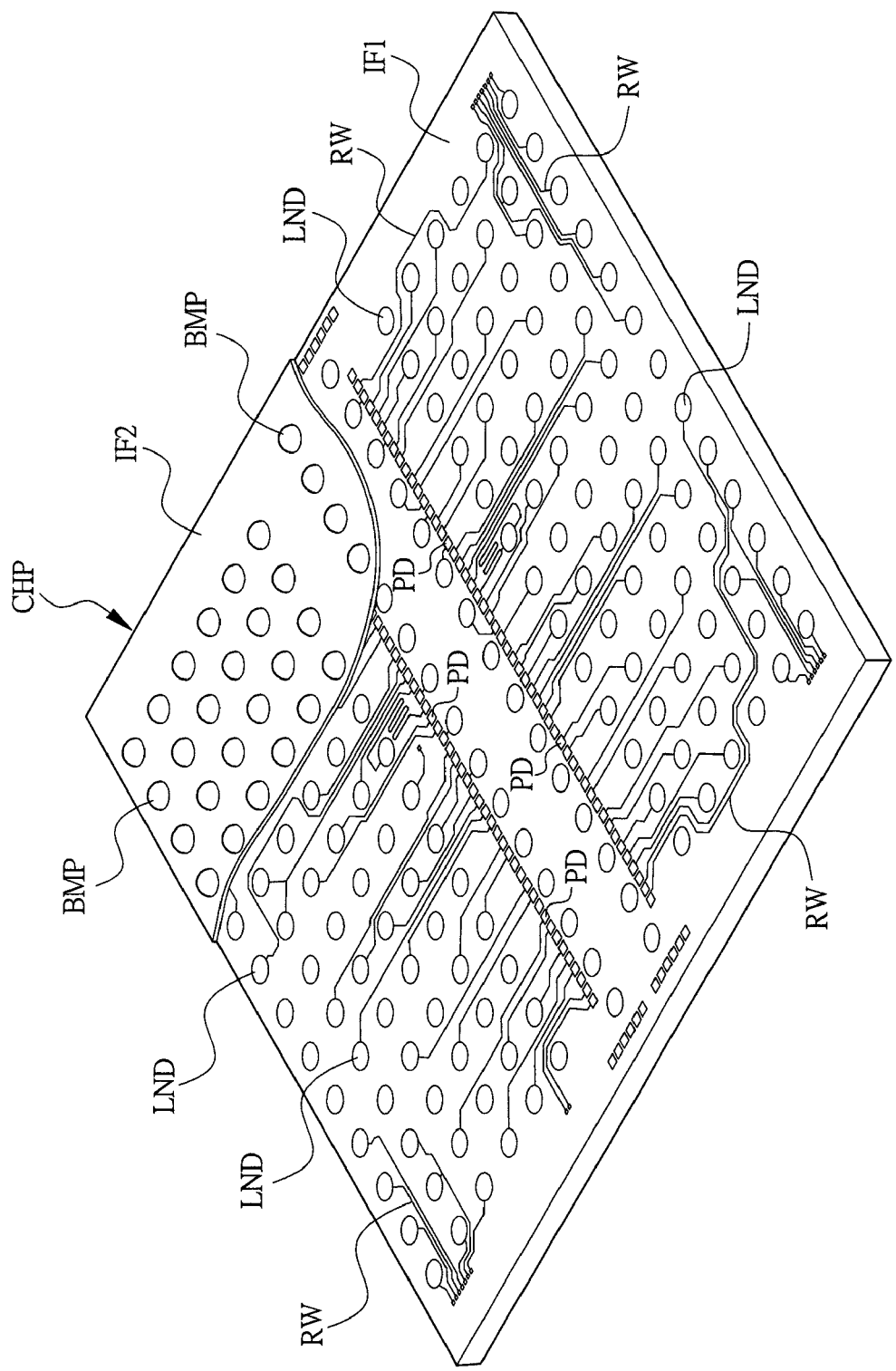
FIG. 2 is a perspective view showing an underlayer structure of the bump electrodes formed on the semiconductor chip.

FIG. 2 is a perspective view showing an underlayer structure of the bump electrodes BMP formed on the semiconductor chip CHP. Incidentally, in the normal semiconductor chip CHP which does not employ the WPP technology, the pads are formed on the top wiring layer of the semiconductor chip. In the normal semiconductor chip, semiconductor elements such as MISFET (Metal Insulator Semiconductor Field Effect Transistor) are formed inside the semiconductor chip, and multilayer wirings are formed on the semiconductor elements. Further, pads are formed on the top layer of the multilayer wirings. In other words, in the normal semiconductor chip, the pads are formed on the surface of the top layer. Also, in the packaging technology of the normal semiconductor chip, for example, the semiconductor chip is mounted on the wiring board (may be lead frame) and the terminals on the wiring board and the pads PD formed on the semiconductor chip are connected by wires, and thereafter, the semiconductor chip is sealed with resin.

Meanwhile, the structure of the semiconductor chip CHP using the WPP technology will be described with reference to FIG. 2. First, though not shown in FIG. 2, semiconductor elements such as MISFET are formed on a semiconductor substrate (not shown) that makes up the semiconductor chip CHP, and multilayer wirings are formed on the semiconductor elements. Further, the pads PD are formed on the top layer of the multilayer wirings. Although the normal semiconductor chip has the structure in which the pads are formed on the surface of the semiconductor chip, the packaging is made on the pads PD in the semiconductor chip CHP using the WPP technology. FIG. 2 shows the structure of the upper layer of the pads PD formed in the semiconductor chip CHP. As shown in FIG. 2, in the semiconductor chip CHP using the WPP technology, the rewirings RW electrically connected to the pads PD formed on an insulating film IF1 are formed, and lands LND are formed on the rewirings RW. In other words, the pads PD and the lands LND formed in the semiconductor chip CHP are connected by the rewirings RW. Also, the pads PD, the rewirings RW and the lands LND formed in the semiconductor chip CHP are covered with an insulating film IF2 made of, for example, polyimide resin. Further, openings through which the lands LND are exposed are formed in the insulating film IF2, and the bump electrodes BMP are formed so as to be electrically connected to the lands LND. In this manner, in the semiconductor chip CHP using the WPP technology, the rewirings RW, the lands LND and the bump electrodes BMP are formed in the upper layer of the pads PD to form the packaging. Therefore, since the packaging of the semiconductor chip CHP can be realized with the size of the semiconductor chip CHP, the advantage that the semiconductor device in which the semiconductor chip CHP is packaged can be downsized can be achieved.

Further, the rewirings RW, the lands LND and the bump electrodes BMP formed in the upper layer of the pads PD are formed by applying the wafer process. More specifically, the rewirings RW, the lands LND and the bump electrodes BMP formed in the upper layer of the pads PD are formed by using the wafer process for forming the multilayer wirings and the MISFETs formed in the lower layer of the pads PD. Therefore, in the WPP technology, the process is performed in a state of a semiconductor wafer.

Figure 3:
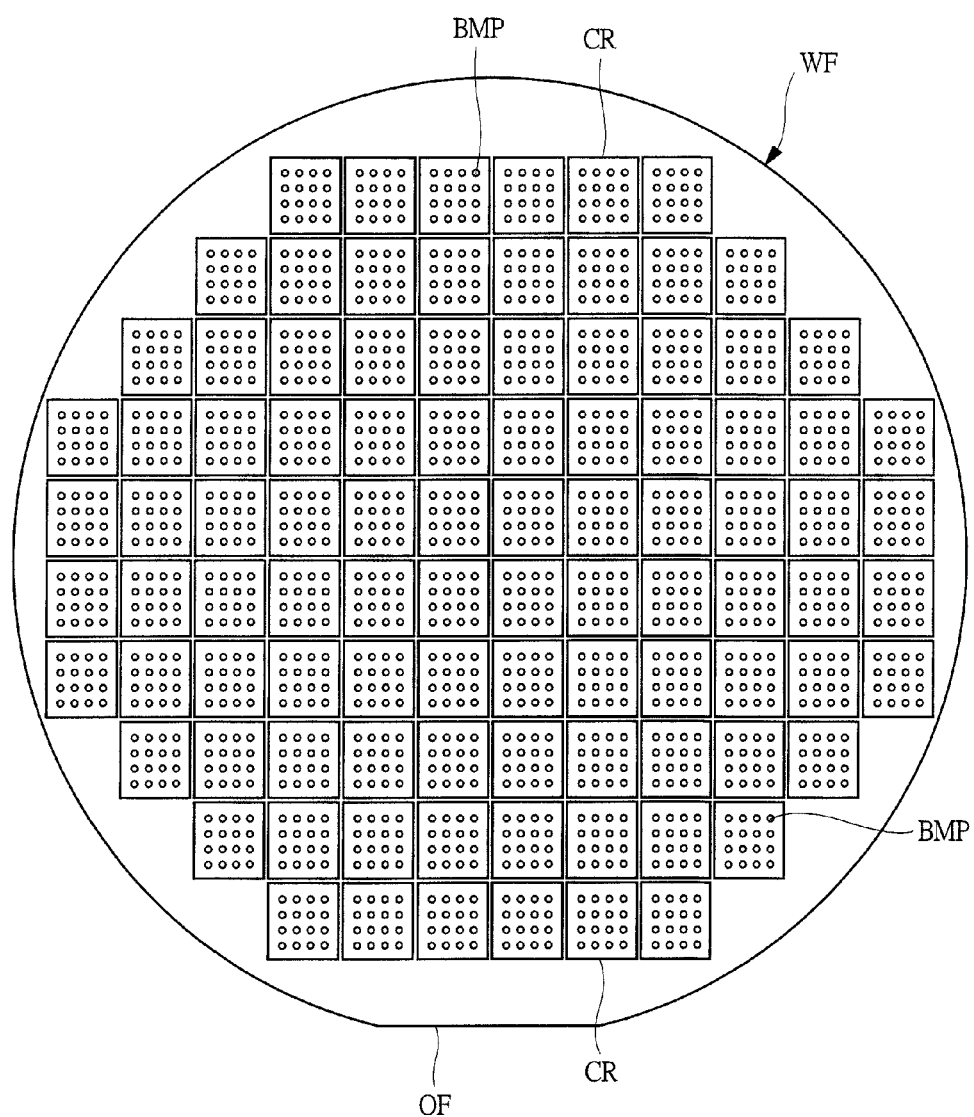
FIG. 3 is a diagram showing the semiconductor wafer.

FIG. 3 is a diagram showing the semiconductor wafer WF. As shown in FIG. 3, the semiconductor wafer WF has an approximately circular shape, but a linear edge called orientation flat OF is provided in the semiconductor wafer WF. This orientation flat OF functions as a mark showing the plane direction of the semiconductor wafer. Note that a V-shaped notch having the same function as the orientation flat OF is used in some cases instead of the orientation flat OF.

A plurality of chip regions CR for forming the semiconductor chips are formed in the inner region of the semiconductor wafer WF. Each of the chip regions CR has a rectangular shape, and an outer peripheral region is formed outside the chip regions CR. The outer peripheral region is a region not to be the chip region CR, and it is inevitably formed because the chip regions CR have a rectangular shape and the semiconductor wafer WF has an approximately circular shape. In each of the chip regions CR formed in the semiconductor wafer WF, the WPP structure shown in FIG. 1 and FIG. 2 is formed. More specifically, the plurality of chip regions CR are formed on the main surface of the semiconductor wafer WF, and the plurality of bump electrodes BMP are formed on the surface of each of the plurality of chip regions CR. Here, the WPP structure mentioned in this specification indicates the packaging structure formed in the upper layer of the pads PD and is defined as a structure including the pads PD, the rewirings RW, the lands LND and the bump electrodes BMP shown in FIG. 2.

As described above, in the WPP technology, the bump electrodes BMP are formed in each of the chip regions CR and the packaging is completed in the state of the semiconductor wafer WF. After that, the process of polishing the rear surface of the semiconductor wafer WF is performed, and then, the process of cutting the semiconductor wafer WF along the dicing lines partitioning the chip regions CR of the semiconductor wafer WF is performed. By cutting the semiconductor wafer WF, individual pieces of the semiconductor chips can be obtained.

At this time, the inventors of the present invention have found that the WPP technology has a following new problem when performing the process of polishing the rear surface of the semiconductor wafer WF and the process of dicing the semiconductor wafer WF. The new problem will be described with reference to the drawings.

Figure 4:
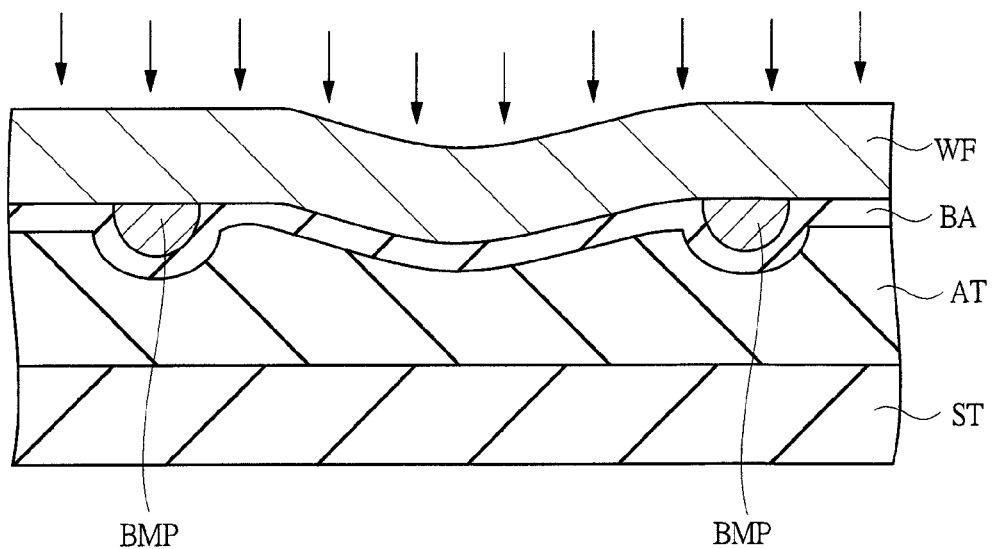
FIG. 4 is a diagram for describing the problem in the conventional technology and is a cross-sectional view showing the manufacturing process of the semiconductor device.

First, as shown in FIG. 3, after forming the bump electrodes BMP in each of the chip regions CR of the semiconductor wafer WF by using the WPP technology, the process of polishing the rear surface (surface on the reverse side of the element forming surface) of the semiconductor wafer WF is performed. This process of polishing the rear surface of the semiconductor wafer WF is performed to reduce the thickness of the semiconductor wafer WF. Specifically, as shown in FIG. 4, an adhesive tape AT is attached onto the element forming surface of the semiconductor wafer WF via a bonding adhesive BA. At this time, since the bump electrodes BMP are formed on the element forming surface of the semiconductor wafer WF, the adhesive tape AT is attached also to the bump electrodes BMP via the bonding adhesive BA. Then, the semiconductor wafer WF is placed on the stage ST with the element forming surface of the semiconductor wafer WF being faced to the stage ST. More specifically, the semiconductor wafer WF is placed on the stage ST so that the element forming surface of the semiconductor wafer WF on which the bump electrodes BMP have been formed and the adhesive tape AT has been attached is adhered tightly to the stage ST. In this case, the rear surface of the semiconductor wafer WF is directed upward. The grinder (not shown) or the like is pushed onto the rear surface of the semiconductor wafer WF directed upward to polish the rear surface of the semiconductor wafer WF.

Here, on the element forming surface of the semiconductor wafer WF, there are the region in which the bump electrodes BMP are formed and the region in which the bump electrode BMP is not formed. Therefore, there is the difference between the polishing pressure applied to the region in which the bump electrodes BMP are formed and the polishing pressure applied to the region in which the bump electrode BMP is not formed. More specifically, as shown in FIG. 4, the warpage occurs in the semiconductor wafer WF in the region in which the bump electrode BMP is not formed. In other words, since the region in which the bump electrodes BMP are formed and the region in which the bump electrode BMP is not formed exist on the element forming surface of the semiconductor wafer WF, the polishing pressure applied to the semiconductor wafer WF becomes uneven.

Figure 5:
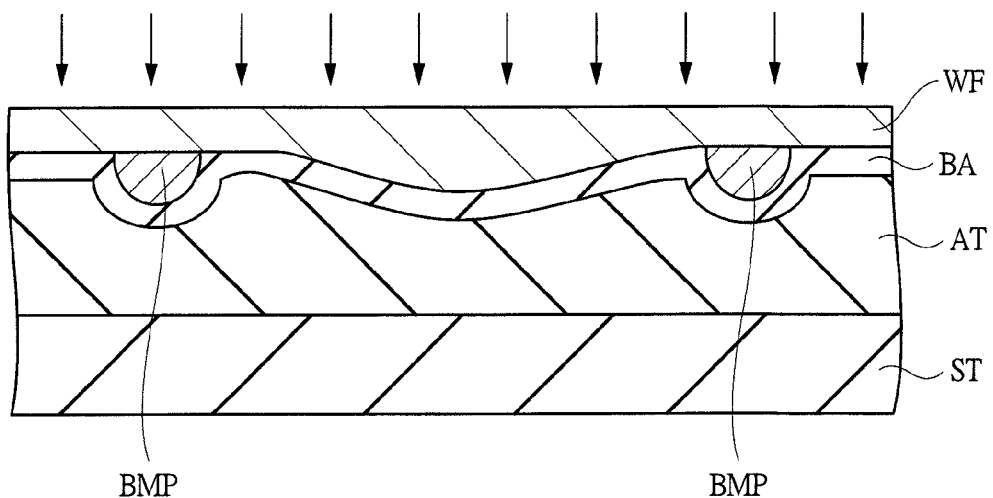
FIG. 5 is a diagram for describing the problem in the conventional technology and is a cross-sectional view showing the manufacturing process of the semiconductor device continued from FIG. 4.
Figure 6:
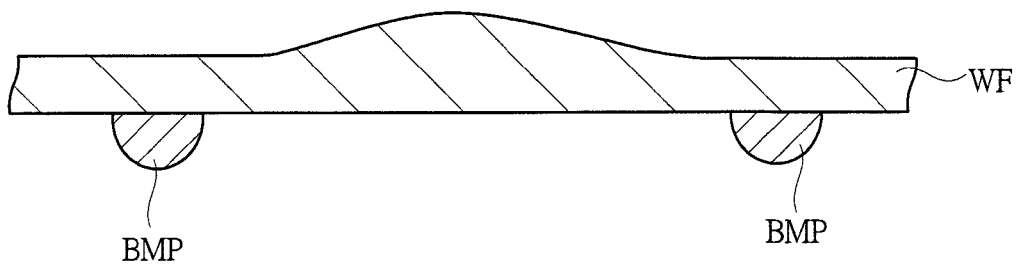
FIG. 6 is a diagram for describing the problem in the conventional technology and is a cross-sectional view showing the manufacturing process of the semiconductor device continued from FIG. 5.

Therefore, when the rear surface of the semiconductor wafer WF is polished, the variation in thickness occurs in the semiconductor wafer WF as shown in FIG. 5. Specifically, in the regions of the semiconductor wafer, the semiconductor wafer has a small thickness in the region in which the bump electrodes BMP are disposed densely because the polishing pressure is high, and in contrast, the semiconductor wafer has a large thickness in the region in which the bump electrodes BMP are disposed less densely because the polishing pressure is low. Accordingly, as shown in FIG. 6, after the process of polishing the rear surface of the semiconductor wafer WF is completed, the thickness of the region of the semiconductor wafer WF in which the bump electrodes BMP are formed is smaller than the thickness of the region of the semiconductor wafer WF in which the bump electrode BMP is not formed.

Figure 7:
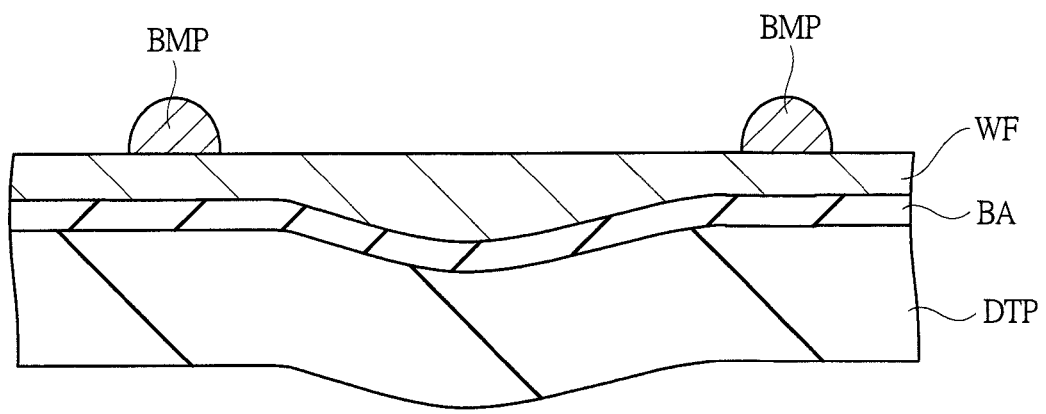
FIG. 7 is a diagram for describing the problem in the conventional technology and is a cross-sectional view showing the manufacturing process of the semiconductor device continued from FIG. 6.

Next, the process of dicing the semiconductor wafer WF is performed. Specifically, as shown in FIG. 7, a dicing tape DTP is attached onto the rear surface of the semiconductor wafer WF via a bonding adhesive BA. At this time, since there is the variation in thickness in the semiconductor wafer WF depending on the presence of the bump electrodes BMP disposed on the element forming surface of the semiconductor wafer WF, the dicing tape DTP is attached in reflection of the variation in thickness.

Figure 8:
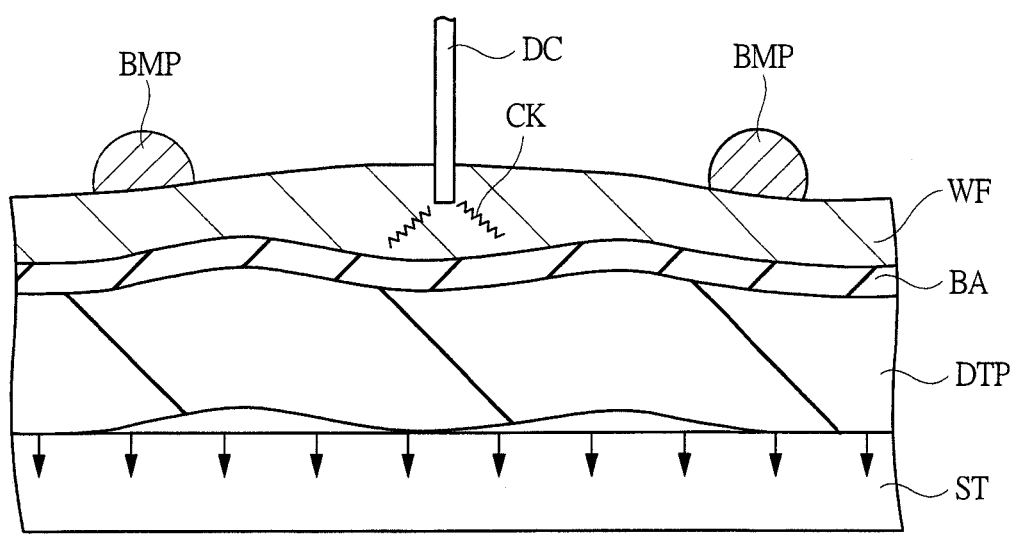
FIG. 8 is a diagram for describing the problem in the conventional technology and is a cross-sectional view showing the manufacturing process of the semiconductor device continued from FIG. 7.

Subsequently, as shown in FIG. 8, the semiconductor wafer WF is fixed to the stage (chuck table) ST with the rear surface of the semiconductor wafer WF to which the dicing tape DTP has been attached being faced to the stage ST. At this time, the semiconductor wafer WF is fixed by the vacuum suction force from the stage ST. In this case, the semiconductor wafer WF has the variation in thickness depending on the presence of the bump electrodes BMP formed on the element forming surface. Specifically, the thickness of the semiconductor wafer WF in the region in which the bump electrode BMP is not formed is larger than the thickness of the semiconductor wafer WF in the region in which the bump electrodes BMP are formed. Therefore, when the semiconductor wafer WF is fixed to the stage ST, due to the variation in thickness described above, the variation in height occurs in the upper surface (element forming surface) of the semiconductor wafer WF. At this time, since no bump electrode BMP is formed on the dicing line to be cut by the dicing cutter DC, the thickness of the semiconductor wafer WF in the region in which the dicing line is formed is larger than that in the region in which the bump electrodes BMP are formed. As a result, the semiconductor wafer WF on the dicing line has a raised shape (convex shape).

When the semiconductor wafer WF is cut in this state by the dicing cutter DC along the dicing line, the stress generation is generated in the semiconductor wafer WF due to the variation in thickness of the semiconductor wafer WF. Specifically, since the thickness of the semiconductor wafer WF on the dicing line is larger than the thickness of the semiconductor wafer WF in the adjacent region in which the bump electrodes BMP are formed, the semiconductor wafer WF on the dicing line has a convex shape. As a result, the tensile stress is generated in the dicing line. Accordingly, when trenches are formed along the dicing line by the dicing cutter DC, cracks CK are likely to be formed from the inside of the trench to the outside of the trench due to the tensile stress acting toward the outside from the inside of the trench. When the cracks CK as described above are formed, the individual pieces of the semiconductor chips diced from the semiconductor wafer become defective. This problem becomes more obvious as the thickness of the semiconductor wafer WF is reduced. For example, according to the examination by the inventors of the present invention, when the thickness of the semiconductor wafer WF is 200 μm or more, the stress distribution caused by the variation in thickness of the semiconductor wafer WF does not cause any serious problem because of the rigidity of the semiconductor wafer WF. More specifically, the following fact has been found. That is, when the thickness of the semiconductor wafer WF is large, the occurrence of the cracks caused by the tensile stress generated on the dicing line is not obvious because it is suppressed by the rigidity of the semiconductor wafer WF. Meanwhile, when the thickness of the semiconductor wafer WF is reduced to 200 μm or less, the occurrence of the cracks caused by the tensile stress generated on the dicing line becomes obvious due to the variation in thickness depending on the presence of the bump electrodes formed on the semiconductor wafer WF.

Figure 9:
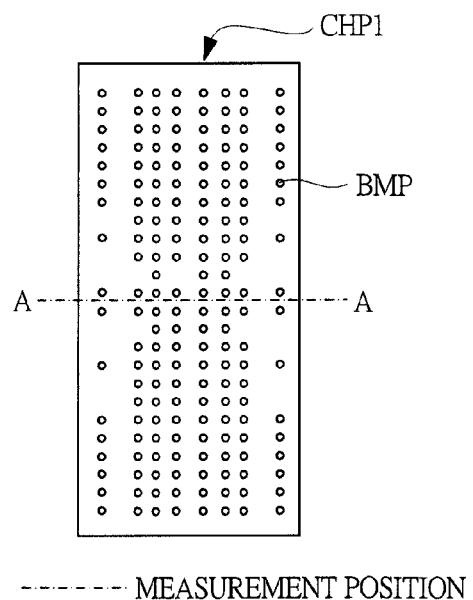
FIG. 9 is a diagram showing the semiconductor chip in which the cracks are formed.

Specifically, the result of the measurement of the thickness distribution of the semiconductor chips in which the cracks are formed will be described. First, FIG. 9 is a diagram showing a semiconductor chip CHP1 in which the cracks are formed. The semiconductor chip CHP1 shown in FIG. 9 has the WPP structure, and the plurality of bump electrodes BMP are formed on the main surface (element forming surface) of the semiconductor chip CHP1. The bump electrodes BMP formed on the semiconductor chip CHP1 are disposed densely in the central region of the semiconductor chip CHP1, and are disposed less densely in the peripheral region (edge region, dicing region before cutting) of the semiconductor chip CHP1.

Figure 10:
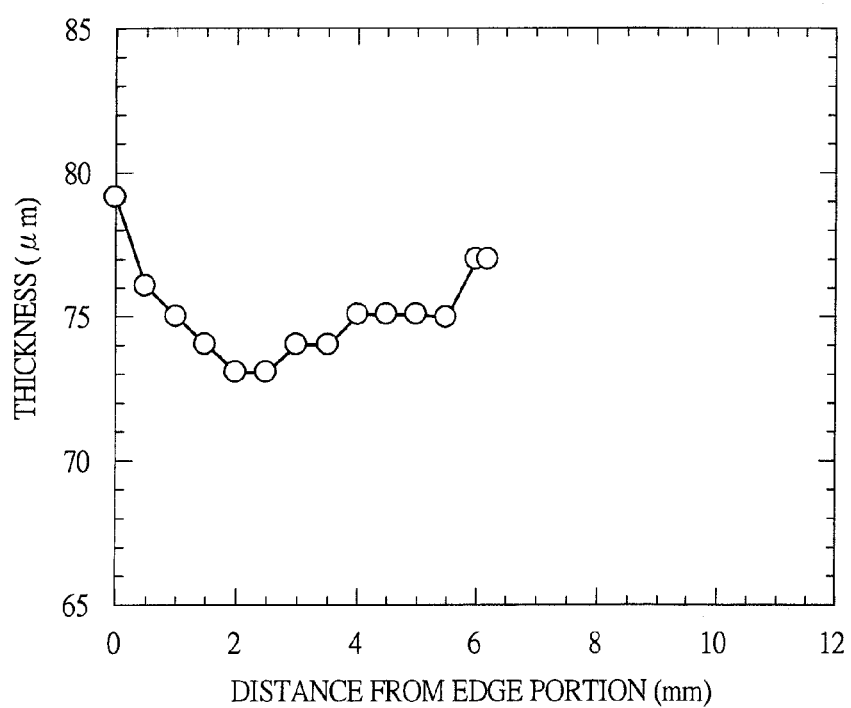
FIG. 10 is a graph showing the thickness distribution on the cross section A-A of the semiconductor chip shown in FIG. 9.

FIG. 10 is a graph showing the thickness distribution on the cross section A-A of the semiconductor chip CHP1 shown in FIG. 9. As shown in FIG. 10, it can be understood that the thickness of the semiconductor chip CHP1 is small in the central region in which the density of the bump electrodes BMP is high and the thickness of the semiconductor chip CHP1 is large in the peripheral region (edge region, dicing region before cutting) in which the density of the bump electrodes BMP is low.

Figure 11:
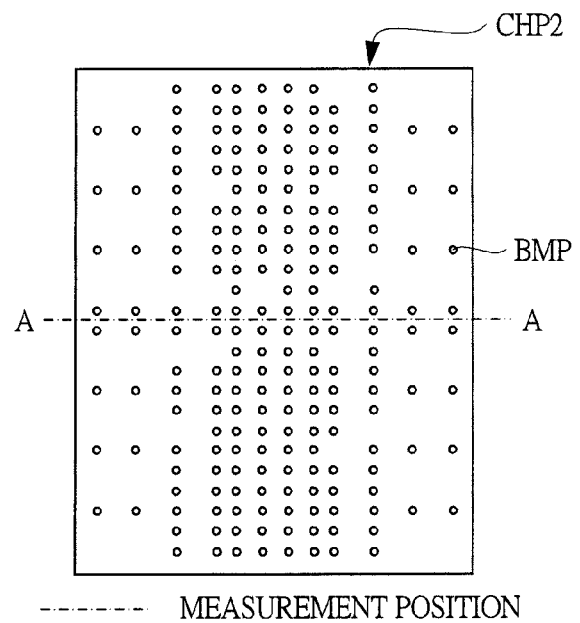
FIG. 11 is a diagram showing the semiconductor chip in which the cracks are formed.

Next, FIG. 11 is a diagram showing a semiconductor chip CHP2 in which cracks are formed. The semiconductor chip CHP2 shown in FIG. 11 also has the WPP structure, and a plurality of bump electrodes BMP are formed on a main surface (element forming surface) of the semiconductor chip CHP2. The bump electrodes BMP formed in the semiconductor chip CHP2 are disposed densely in the central region of the semiconductor chip CHP2, and are disposed less densely in the peripheral region (edge region, dicing region before cutting) of the semiconductor chip CHP2.

Figure 12:
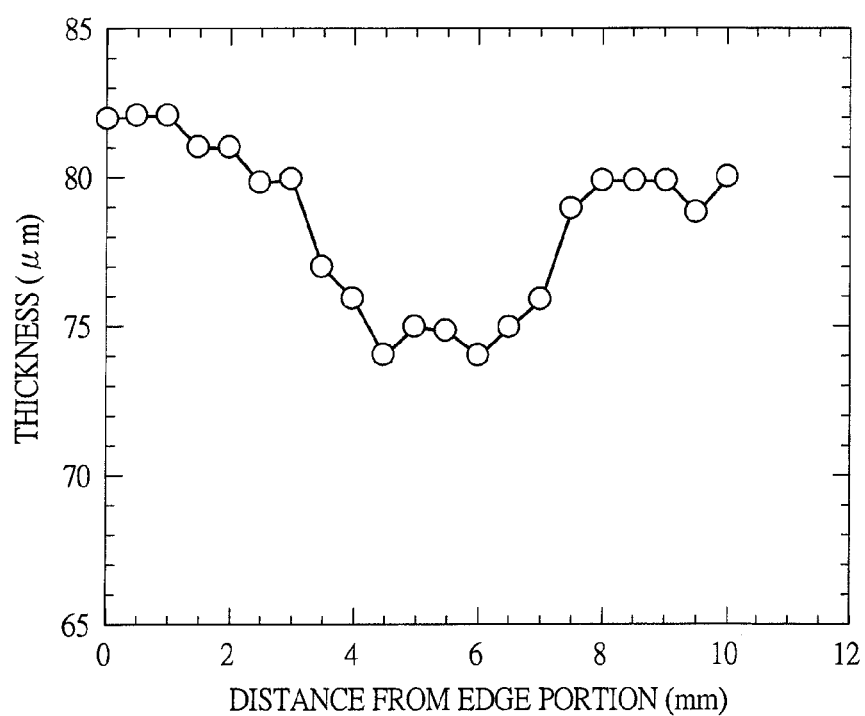
FIG. 12 is a graph showing the thickness distribution on the cross section A-A of the semiconductor chip shown in FIG. 11.

FIG. 12 is a graph showing the thickness distribution on the cross section A-A of the semiconductor chip CHP2 shown in FIG. 11. As shown in FIG. 12, it can be understood that the thickness of the semiconductor chip CHP2 is small in the central region in which the density of the bump electrodes BMP is high and the thickness of the semiconductor chip CHP2 is large in the peripheral region (edge region, dicing region before cutting) in which the density of the bump electrodes BMP is low.

Figure 13:
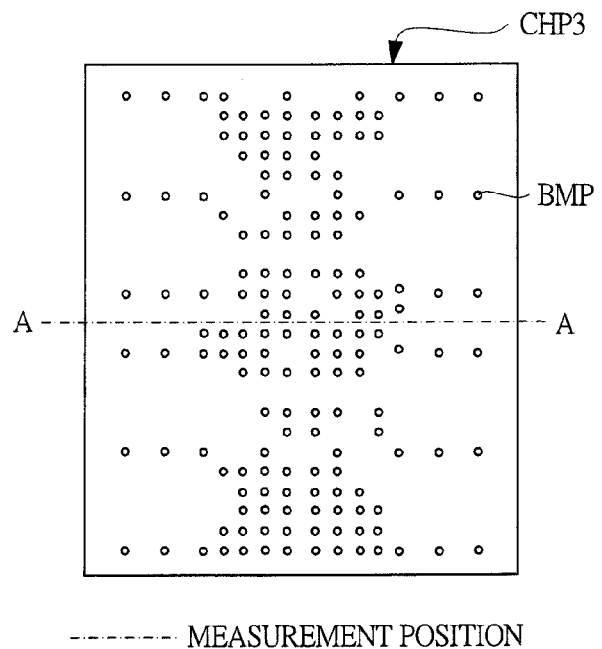
FIG. 13 is a diagram showing the semiconductor chip in which the cracks are formed.

Similarly, FIG. 13 is a diagram showing a semiconductor chip CHP3 in which cracks are formed. The semiconductor chip CHP3 shown in FIG. 13 also has the WPP structure, and a plurality of bump electrodes BMP are formed on a main surface (element forming surface) of the semiconductor chip CHP3. The bump electrodes BMP formed in the semiconductor chip CHP3 are disposed densely in the central region of the semiconductor chip CHP3, and are disposed less densely in the peripheral region (edge region, dicing region before cutting) of the semiconductor chip CHP3.

Figure 14:
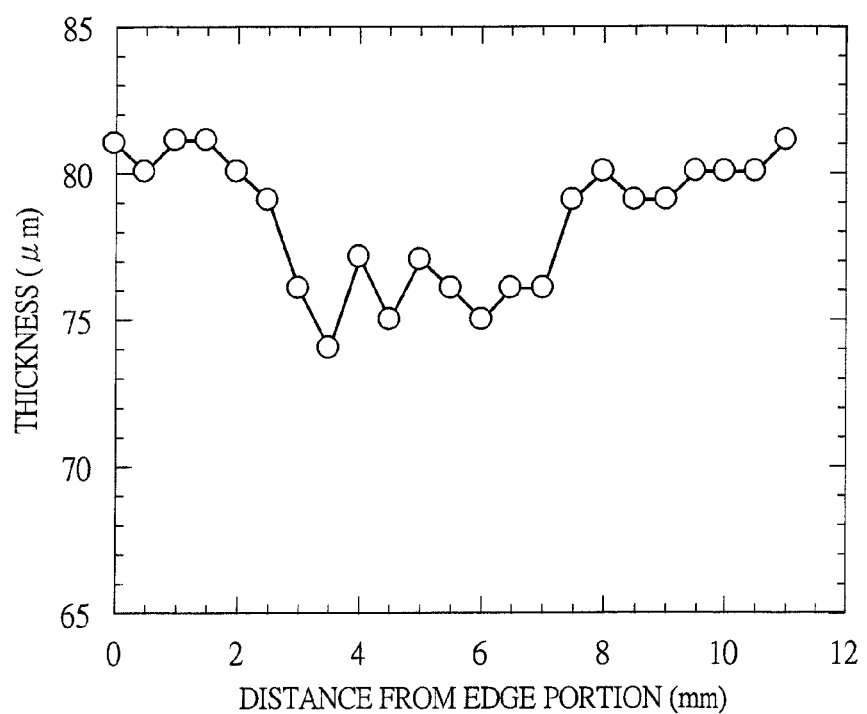
FIG. 14 is a graph showing the thickness distribution on the cross section A-A of the semiconductor chip shown in FIG. 13.

FIG. 14 is a graph showing the thickness distribution on the cross section A-A of the semiconductor chip CHP3 shown in FIG. 13. As shown in FIG. 14, it can be understood that the thickness of the semiconductor chip CHP3 is small in the central region in which the density of the bump electrodes BMP is high and the thickness of the semiconductor chip CHP3 is large in the peripheral region (edge region, dicing region before cutting) in which the density of the bump electrodes BMP is low.

As described above, it can be understood that the thickness in the peripheral region in which the density of the bump electrodes BMP is low is larger than the thickness in the central region in which the density of the bump electrodes BMP is high in all of the semiconductor chips CHP1 to CHP3 in which the cracks are formed.

Figure 15:
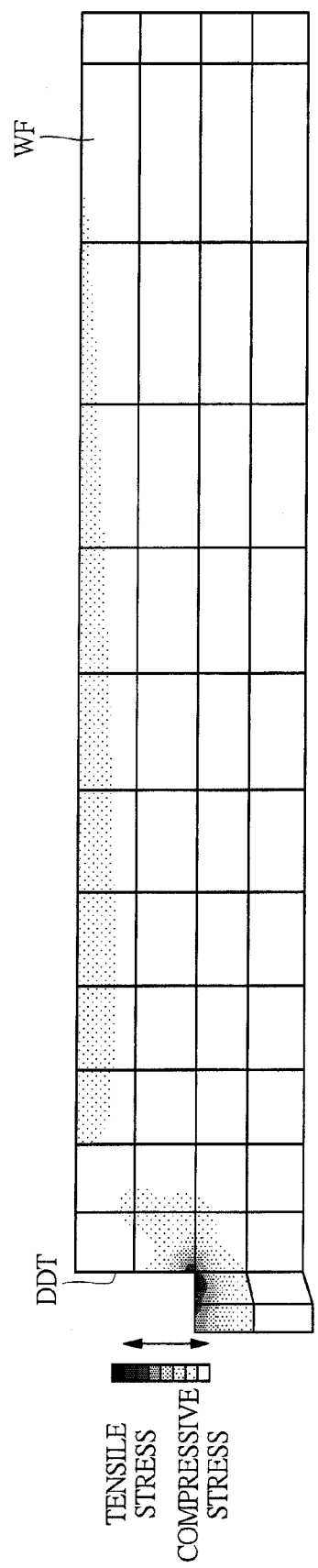
FIG. 15 is a diagram showing the stress distribution in the case where the dicing is performed in the state where the dicing region has the thickness larger than that of the other region.

Further, FIG. 15 shows the result of the analysis of the stress distribution generated in the semiconductor wafer WF by the vacuum suction force of the stage (chuck table) in the dicing process. FIG. 15 is a diagram showing the stress distribution in the case where the dicing is performed in the state where the dicing region has the thickness larger than that of the other region. In FIG. 15, the stress distribution in the case where the trench DDT is formed in the dicing region of the semiconductor wafer WF is shown. It can be understood from FIG. 15 that the tensile stress is applied to the region close to the bottom and corner portions of the trench DDT. More specifically, it can be understood from the result shown in FIG. 15 that the tensile stress is applied to the trench DDT formed in the dicing region when the thickness of the dicing region of the semiconductor wafer WF is larger than that of other region. Accordingly, it can be understood that the cracks are likely to be formed from the trench DDT toward the outside when the thickness of the dicing region of the semiconductor wafer WF is larger than that of the other region.

From the above, it is possible to obtain the result that the thickness in the peripheral region in which the density of the bump electrodes BMP is low is larger than the thickness in the central region in which the density of the bump electrodes BMP is high in the semiconductor chips CHP1 to CHP3 (result shown in FIG. 9 to FIG. 14) and the result that the tensile stress is applied to the trench DDT formed in the dicing region when the thickness in the dicing region of the semiconductor wafer WF is larger than that of the other region (result shown in FIG. 15). It would appear that these results support the validity of the mechanism that, when the variation in thickness occurs in the regions of the semiconductor wafer, the stress distribution is generated in the semiconductor wafer due to this variation in thickness and the cracks are formed in the semiconductor chip in the dicing process due to the stress distribution generated in the semiconductor wafer as described above.

Then, the inventors of the present invention have devised the semiconductor device in order to prevent the occurrence of the cracks from the knowledge based on the above-described mechanism. The technical idea of the first embodiment for devising the semiconductor device will be described below.

First, the manufacturing method of the semiconductor device in the first embodiment will be described with reference to the drawings. In the manufacturing method of the semiconductor device in the first embodiment, the process of forming MISFETs on a semiconductor substrate (semiconductor wafer) and the process of forming multilayer wirings on the MISFETs will be first described. Thereafter, the rewiring process will be described.

Figure 16:
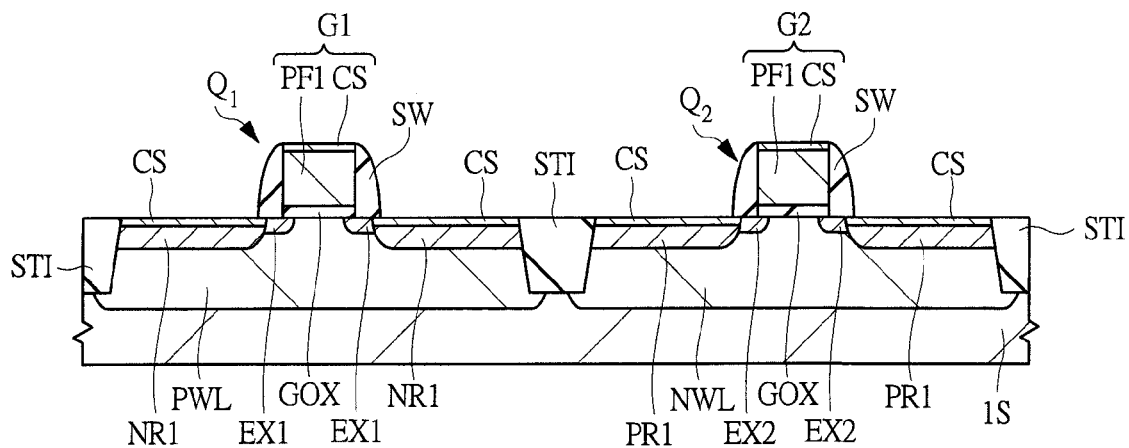
FIG. 16 is a cross-sectional view showing the manufacturing process of the semiconductor device in the first embodiment.

FIG. 16 shows an n channel MISFET $Q_1$ and a p channel MISFET $Q_2$ formed on a semiconductor substrate 1S. The manufacturing method of the semiconductor elements typified by the n channel MISFET ($Q_1$ and the p channel MISFET $Q_2$ will be described below.

First, the semiconductor substrate 1S made of single crystal silicon to which a p-type impurity such as boron (B) is introduced is prepared as shown in FIG. 16. At this time, the semiconductor substrate 15 is in a state of a semiconductor wafer with an approximately disk-like shape. Then, element isolation regions STI for isolating the elements are formed in a CMISFET forming region of the semiconductor substrate 1S. The element isolation region STI is provided so that the elements do not interfere with each other. This element isolation region STI can be formed by using, for example LOCOS (Local Oxidation of Silicon) method or the STI (Shallow Trench Isolation) method. For example, in the STI method, the element isolation region is formed in the following manner. That is, element isolation trenches are first formed in the semiconductor substrate 1S by using the photolithography technology and the etching technology. Then, a silicon oxide film is formed on the semiconductor substrate so as to fill the element isolation trenches, and then, unnecessary part of the silicon oxide film formed on the semiconductor substrate is removed by the CMP (Chemical Mechanical Polishing) method. By this means, the element isolation regions STI in which only the element isolation trenches are filled with the silicon oxide film can be formed.

Next, wells are formed by introducing impurities in the active regions isolated by the element isolation regions STI. For example, a p-type well PWL is formed in the n channel MISFET forming region of the active regions, and an n-type well NWL is formed in the p channel MISFET forming region of the active regions. The p-type well PWL is formed by introducing a p-type impurity such as boron into the semiconductor substrate 1S by the ion implantation method. Similarly, the n-type well NWL is formed by introducing an n-type impurity such as phosphorus (P) or arsenic (As) into the semiconductor substrate 1S by the ion implantation method.

Subsequently, semiconductor regions (not shown) for forming channels are formed in a surface region of the p-type well PWL and a surface region of the n-type well NWL. The semiconductor regions for forming channels are formed in order to adjust the threshold voltage for forming the channel.

Next, a gate insulating film GOX is formed on the semiconductor substrate 1S. The gate insulating film GOX is made of, for example, a silicon oxide film and can be formed by using, for example, the thermal oxidation method. However, the gate insulating film GOX is not limited to the silicon oxide film and various modifications can be made. For example, a silicon oxynitride film (SiON) can be used as the gate insulating film GOX. Further, it is also possible to form the gate insulating film GOX from a high dielectric constant film having a dielectric constant higher than that of a silicon oxide film. By using a material having a dielectric constant higher than that of a silicon oxide film, the physical thickness can be increased without changing the capacitance. Since the physical thickness can be increased without changing the capacitance when the high dielectric constant film is used, the leakage current can be reduced.

Subsequently, a polysilicon film PF1 is formed on the gate insulating film BOX. The polysilicon film PF1 can be formed by using, for example, the CVD method. Then, an n-type impurity such as phosphorus or arsenic is introduced into the polysilicon film PF1 formed in the n channel MISFET forming region by using the photolithography technology and the ion implantation method. Similarly, a p-type impurity such as boron is introduced into the polysilicon film PF1 formed in the p channel MISFET forming region.

Next, the polysilicon film PF1 is processed by the etching using a patterned resist film as a mask, thereby forming a gate electrode G1 in the n channel MISFET forming region and a gate electrode G2 in the p channel MISFET forming region.

Here, an n-type impurity is introduced into the polysilicon film PF1 in the gate electrode G1 in the n channel MISFET forming region. Therefore, since the work function value of the gate electrode G1 can be set to a value close to a conduction band of silicon (4.15 eV), the threshold voltage of the n channel MISFET can be reduced. On the other hand, a p-type impurity is introduced into the polysilicon film PF1 in the gate electrode G2 in the p channel MISFET forming region. Therefore, since the work function value of the gate electrode G2 can be set to a value close to a valence band of silicon (5.15 eV), the threshold voltage of the p channel MISFET can be reduced. As described above, in the first embodiment, the threshold voltage can be reduced in both of the n channel MISFET and the p channel MISFET (dual gate structure).

Subsequently, by using the photolithography technology and the ion implantation method, shallow n-type impurity diffusion regions EX1 aligned with the gate electrode G1 of the n channel MISFET are formed. The shallow n-type impurity diffusion region EX1 is a semiconductor region. Similarly, shallow p-type impurity diffusion regions EX2 are formed in the p channel MISFET forming region. The shallow p-type impurity diffusion regions EX2 are formed so as to be aligned with the gate electrode G2 of the p channel MISFET. The shallow p-type impurity diffusion regions EX2 can be formed by using the photolithography technology and the ion implantation method.

Next, a silicon oxide film is formed on the semiconductor substrate 1S. The silicon oxide film can be formed by using, for example, the CVD method. Then, sidewalls SW are formed on the sidewalls of the gate electrodes G1 and G2 by anisotropically etching the silicon oxide film. Although the sidewalls SW are formed from a single layer film of a silicon oxide film in this case, the sidewalls SW are not limited to these, and sidewalls SW made of a stacked film of a silicon nitride film and a silicon oxide film may be formed.

Subsequently, by using the photolithography technology and the ion implantation method, deep n-type impurity diffusion regions NR1 aligned with the sidewalls SW are formed in the n channel MISFET forming region. The deep n-type impurity diffusion region NR1 is a semiconductor region. The deep n-type impurity diffusion region NR1 and the shallow n-type impurity diffusion region EX1 form a source region. Similarly, the other deep n-type impurity diffusion region NR1 and the other shallow n-type impurity diffusion region EX1 form a drain region. By forming the source region and the drain region from the shallow n-type impurity diffusion regions EX1 and the deep n-type impurity diffusion regions NR1, the source region and the drain region can have the LDD (Lightly Doped Drain) structure.

Similarly, deep p-type impurity diffusion regions PR1 aligned with the sidewalls SW are formed in the p channel MISFET forming region. The deep p-type impurity diffusion regions PR1 and the shallow p-type impurity diffusion regions EX2 form a source region and a drain region. Therefore, the source region and the drain region have the LDD structure also in the p channel MISFET.

After the deep n-type impurity diffusion regions NR1 and the deep p-type impurity diffusion regions PR1 are formed as described above, the heat treatment at about 1000° C. is carried out. By this means, the introduced impurities are activated.

Thereafter, a cobalt film is formed on the semiconductor substrate 1S. At this time, the cobalt film is formed so as to be directly in contact with the gate electrodes G1 and G2. Similarly, the cobalt film is directly in contact also with the deep n-type impurity diffusion regions NR1 and the deep p-type impurity diffusion region PR1.

The cobalt film can be formed by using, for example, the sputtering method. Then, after forming the cobalt film, the heat treatment is carried out to react the polysilicon films PF1 forming the gate electrodes G1 and G2 with the cobalt film, thereby forming cobalt silicide films CS. In this manner, the gate electrodes G1 and G2 have the stacked structure of the polysilicon film PF1 and the cobalt silicide film CS. The cobalt silicide film CS is formed so as to reduce the resistance of the gate electrodes G1 and G2. Similarly, by the above-described heat treatment, the silicon and the cobalt film are reacted with each other also on the surface of the deep n-type impurity diffusion region NR1 and the deep p-type impurity diffusion region PR1, thereby forming the cobalt silicide film CS. Therefore, resistance can be reduced also in the deep n-type impurity diffusion region NR1 and the deep p-type impurity diffusion region PR1.

Then, the unreacted cobalt film is removed from the semiconductor substrate 1S. Note that, although the cobalt silicide film CS is formed in the first embodiment, for example, a nickel silicide film or a titanium silicide film may be formed instead of the cobalt silicide film CS. In the manner described above, the n channel MISFET $Q_1$ and the p channel MISFET $Q_2$ can be formed on the semiconductor substrate 1S.

Figure 17:
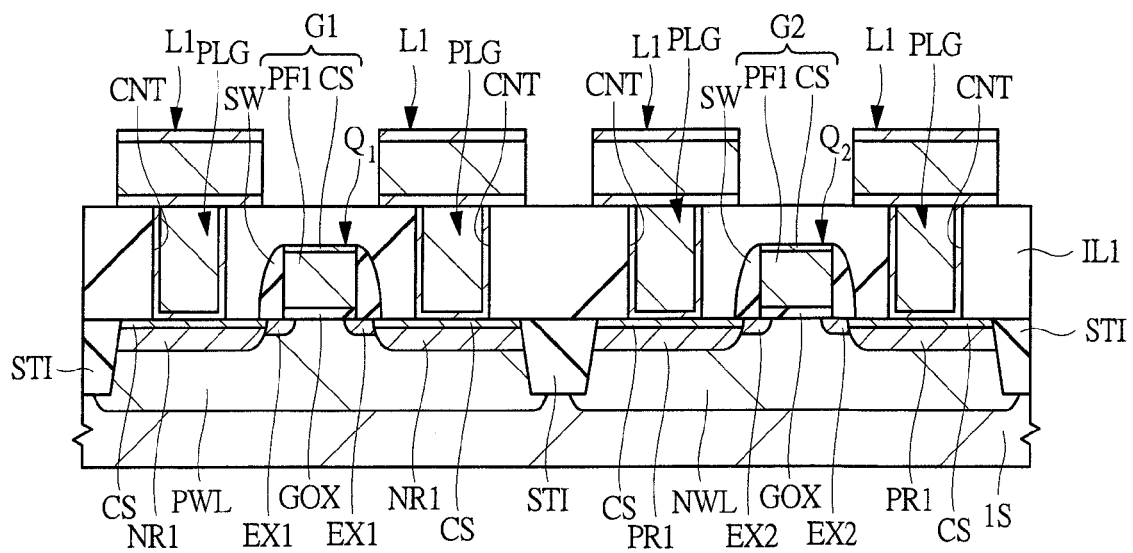
FIG. 17 is a cross-sectional view showing the manufacturing process of the semiconductor device continued from FIG. 16.

Subsequently, the process of forming the multilayer wirings on the semiconductor substrate 1S on which the n channel MISFET $Q_1$ and the p channel MISFET $Q_2$ have been formed will be described. As shown in FIG. 17, an interlayer insulating film IL1 is formed on the main surface of the semiconductor substrate 1. The interlayer insulating film IL1 is made of, for example, a silicon oxide film, and can be formed by the CVD method using TEOS (Tetra Ethyl Ortho Silicate) as a material. Thereafter, the surface of the interlayer insulating film IL1 is planarized by using, for example, the CMP (Chemical Mechanical Polishing) method. Note that it is also possible to form the interlayer insulating film IL1 from the stacked film of a silicon nitride film and a silicon oxide film to use the silicon nitride film as an etching stopper film (SAC (Self Align Contact)).

Subsequently, contact holes CNT are formed in the interlayer insulating film IL1 by using the photolithography technology and the etching technology. Then, a titanium/titanium nitride film is formed on the interlayer insulating film IL1 including bottom surfaces and inner walls of the contact holes CNT. The titanium/titanium nitride film is formed of a stacked film of a titanium film and a titanium nitride film, and can be formed by using, for example, the sputtering method. The titanium/titanium nitride film has the so-called barrier properties for preventing the diffusion of tungsten, which is a material of a film to fill the contact holes CNT in the following process, into the silicon.

Subsequently, a tungsten film is formed on the whole main surface of the semiconductor substrate 1S so as to fill the contact holes CNT. This tungsten film can be formed by using, for example, the CVD method. Then, the unnecessary titanium/titanium nitride film and tungsten film formed on the interlayer insulating film IL1 are removed by, for example, the CMP method, thereby forming plugs PLG.

Thereafter, a stacked film made up of a titanium/titanium nitride film, an aluminum film and a titanium/titanium nitride film is formed on the interlayer insulating film IL1 in which the plugs PLG have been formed. The titanium/titanium nitride films and the aluminum film can be formed by using, for example, the sputtering method. Then, the above-described stacked film is patterned by using the photolithography technology and the etching technology. In this manner, the wiring L1 made up of the titanium/titanium nitride film, the aluminum film and the titanium/titanium nitride film can be formed. Further, by repeating the same process, the multilayer wirings can be formed. At this time, the top layer wiring is formed in the top layer of the multilayer wirings. Pads are also formed in the same layer as the top layer wiring. That is, the pads are formed in the top layer of the multilayer wirings. In the above-described manner, the multilayer wirings can be formed.

Note that, although the wiring structure mainly made of an aluminum film has been described in the first embodiment, the wiring structure is not limited to this. For example, a wiring structure having a dual damascene structure mainly made of copper may be adopted. In this case, only the pads in the same layer as the top layer wiring are the aluminum wiring structure, but all the wirings in the layers therebelow are the wiring structure having the dual damascene structure mainly made of copper. In the case of the wiring structure having the dual damascene structure, the wiring trenches and the connection holes are formed in the interlayer insulating film IL1.

Thereafter, a conductive film mainly made of copper is formed in the wiring trenches and the connection holes by the plating method, and the conductive film outside the wiring trenches and the connection holes is polished by the CMP method or the like. In this manner, the wiring structure having the dual damascene structure in which the wiring and the plug are integrally formed in the wiring trench and the connection hole can be formed. Also, a barrier metal film having a function to prevent the diffusion of copper may be formed between the interlayer insulating film IL1 and the conductive film. The barrier metal film is made of, for example, tantalum nitride, tantalum or a stacked film thereof.

Figure 18:
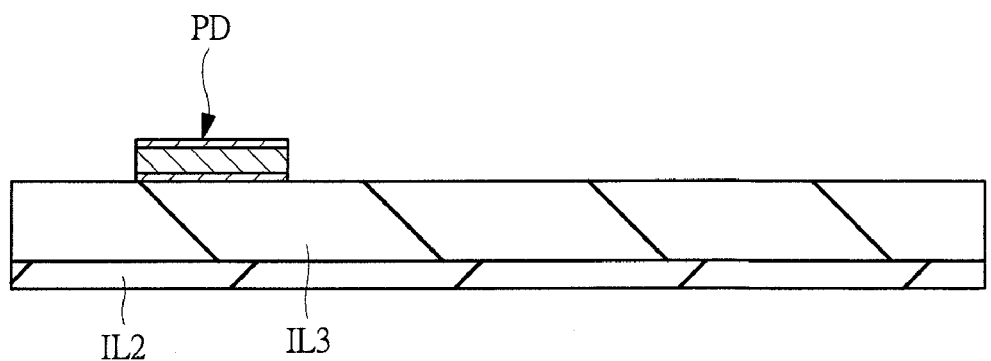
FIG. 18 is a cross-sectional view showing the manufacturing process of the semiconductor device continued from FIG. 17.

Subsequently, the process of forming the rewiring will be described. First, as shown in FIG. 18, the pad PD is formed on the top layer of the multilayer wiring. In FIG. 18, an interlayer insulating film IL3 is formed on an interlayer insulating film IL2, and the pad PD is formed on this interlayer insulating film IL3. The pad PD can be formed by forming a stacked film made up of a titanium/titanium nitride film, an aluminum film and a titanium/titanium nitride film on the interlayer insulating film IL3 and then patterning the stacked film by using the photolithography technology and the etching technology.

Figure 19:
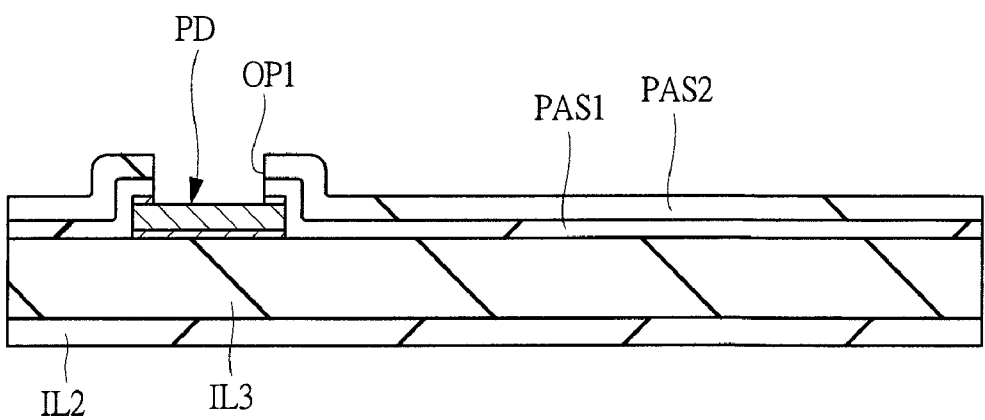
FIG. 19 is a cross-sectional view showing the manufacturing process of the semiconductor device continued from FIG. 18.

Next, as shown in FIG. 19, a surface protection film PAS1 and a surface protection film PAS2 are formed on the interlayer insulating film IL3 on which the pad PD has been formed. The surface protection film PAS1 is formed of a silicon oxide film made of TEOS and can be formed by, for example, the CVD method. On the other hand, the surface protection film PAS2 is formed of a silicon nitride film and can be formed by, for example, the CVD method. Thereafter, an opening OP1 which penetrates through the surface protection film PA2 and the surface protection film PA1 to expose a part of the pad PD is formed by using the photolithography technology and the etching technology. Note that the titanium/titanium nitride film exposed through the opening OP1 is removed.

Subsequently, as shown in FIG. 20, a polyimide resin film PI1 is coated on the surface protection film PAS2 in which the opening OP1 has been formed. This polyimide resin film PI1 is formed on the whole surface (main surface) of the semiconductor wafer. Then, as shown in FIG. 21, an opening OP2 is formed in the polyimide resin film PI1 by using the photolithography technology. The opening OP1 is formed below the opening OP2, and a part of the pad PD is exposed through the opening OP1 and the opening OP2.

Figure 22:
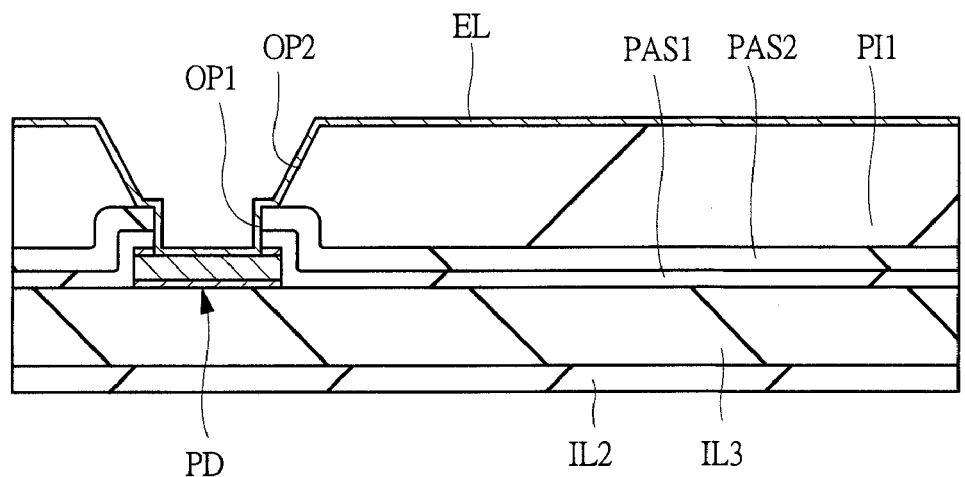
FIG. 22 is a cross-sectional view showing the manufacturing process of the semiconductor device continued from FIG. 21.

Next, as shown in FIG. 22, an electrode layer EL is formed on the polyimide resin film PI1 including the insides of the opening OP1 and the opening OP2 over the whole surface of the semiconductor wafer. More specifically, the electrode layer EL is formed on the whole surface of the semiconductor wafer. This electrode layer EL is electrically connected to the pad PD at the bottom of the opening OP1. The electrode layer EL is formed of, for example, a stacked film of a titanium nitride film and a copper film and can be formed by using, for example, the sputtering method.

Figure 23:
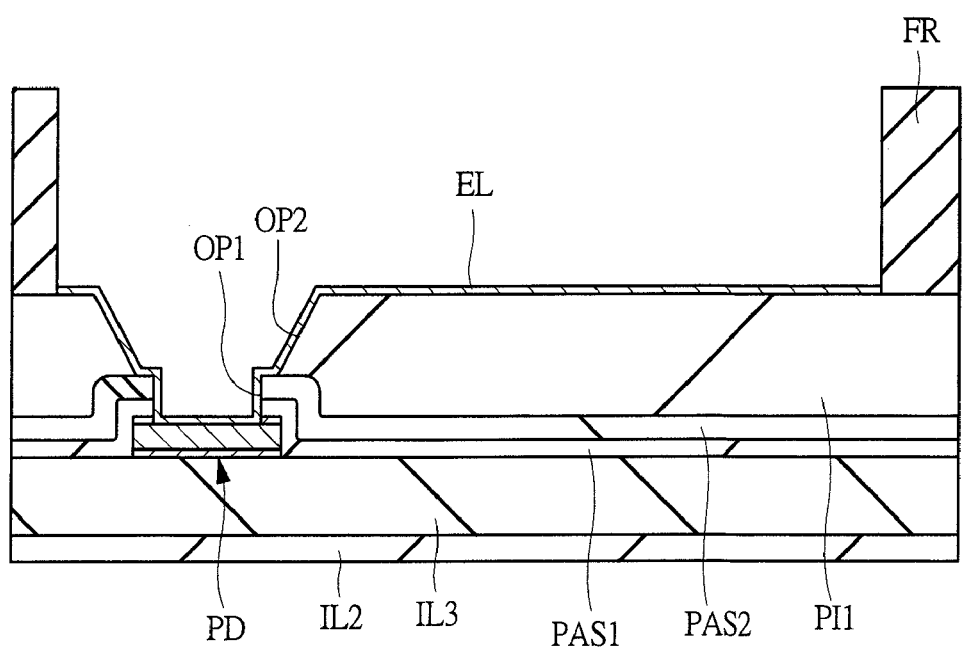
FIG. 23 is a cross-sectional view showing the manufacturing process of the semiconductor device continued from FIG. 22.
Figure 24:
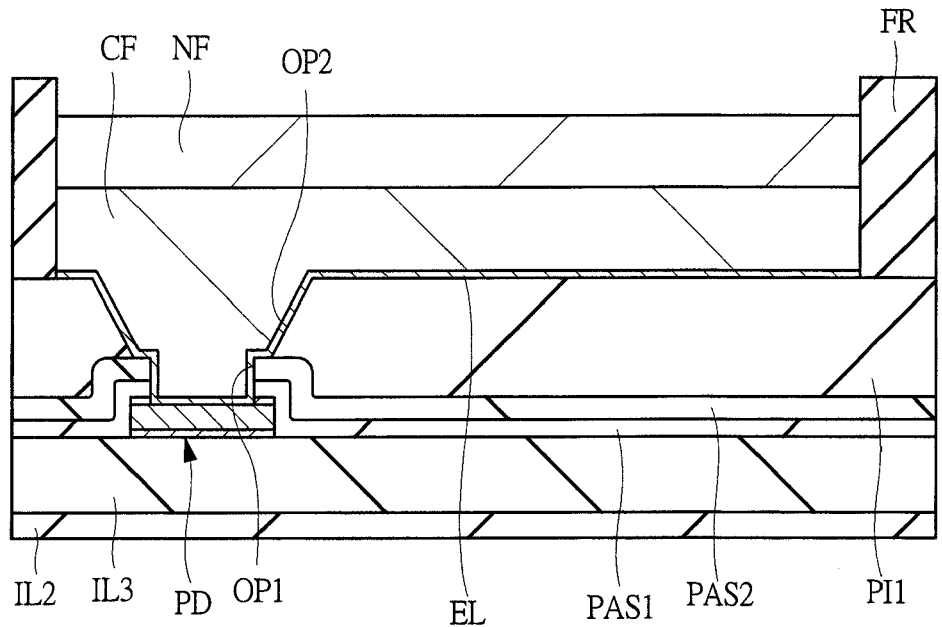
FIG. 24 is a cross-sectional view showing the manufacturing process of the semiconductor device continued from FIG. 23.

Thereafter, as shown in FIG. 23, a resist film FR is coated on the electrode layer EL formed on the whole surface of the semiconductor wafer over the whole surface of the semiconductor wafer, and the resist film FR is patterned by using the photolithography technology to this resist film FR. The patterning of the resist film FR is performed so that the resist film in the region where the rewiring and the land are to be formed is removed and the electrode layer EL is exposed. Then, the rewiring and the land are formed by the electroplating method using the electrode layer EL. Specifically, as shown in FIG. 24, a copper film CF (plating film) and a nickel film NF (plating film) are formed on the electrode layer EL exposed through the opening formed in the resist film FR. The copper film CF and the nickel film NF are to be the rewiring and the land.

Figure 25:
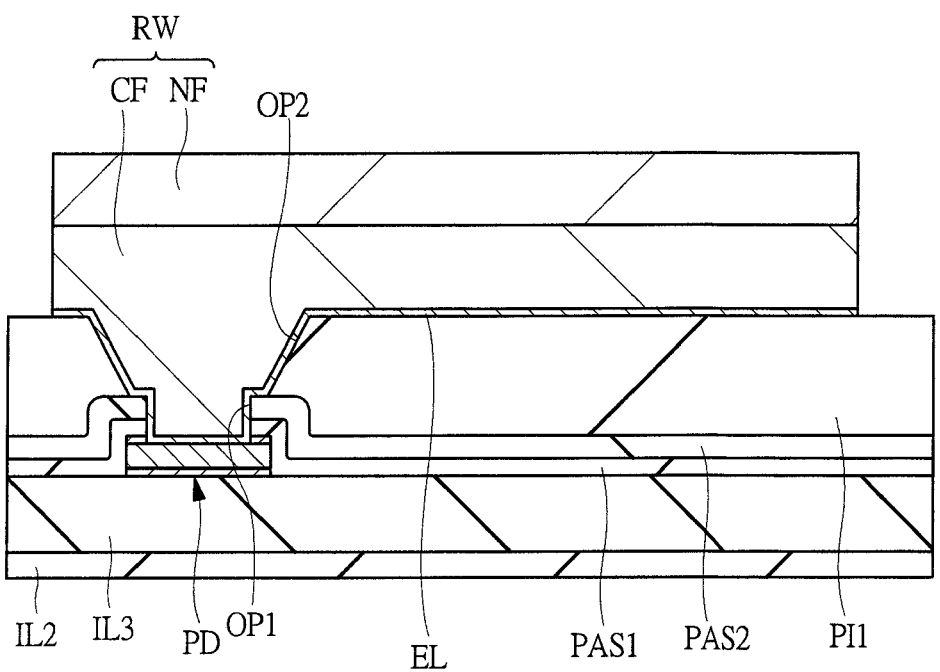
FIG. 25 is a cross-sectional view showing the manufacturing process of the semiconductor device continued from FIG. 24.

Subsequently, as shown in FIG. 25, the patterned resist film FR is removed. In this manner, the rewiring RW electrically connected to the pad PD can be formed. The rewiring RW is made up of the electrode layer EL, the copper film CF and the nickel film NF.

Figure 26:
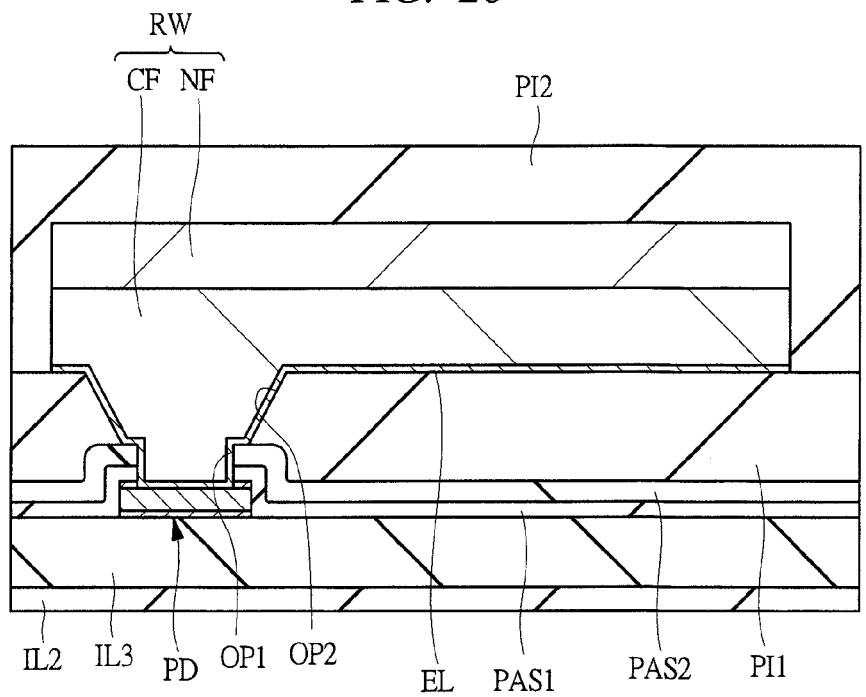
FIG. 26 is a cross-sectional view showing the manufacturing process of the semiconductor device continued from FIG. 25.
Figure 27:
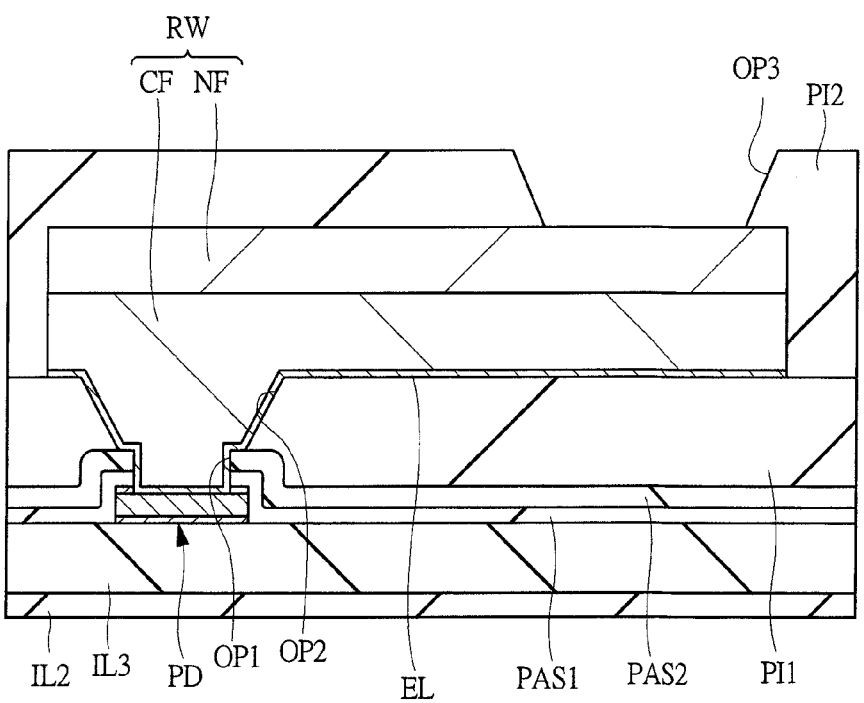
FIG. 27 is a cross-sectional view showing the manufacturing process of the semiconductor device continued from FIG. 26.

Thereafter, as shown in FIG. 26, a polyimide resin film PI2 is formed on the whole surface of the semiconductor wafer so as to cover the rewiring RW over the whole surface of the semiconductor wafer. Then, as shown in FIG. 27, an opening OP3 is formed in the polyimide resin film PI2 by using the photolithography technology. A part of the rewiring RW (land) is exposed through the opening OP3.

Figure 28:
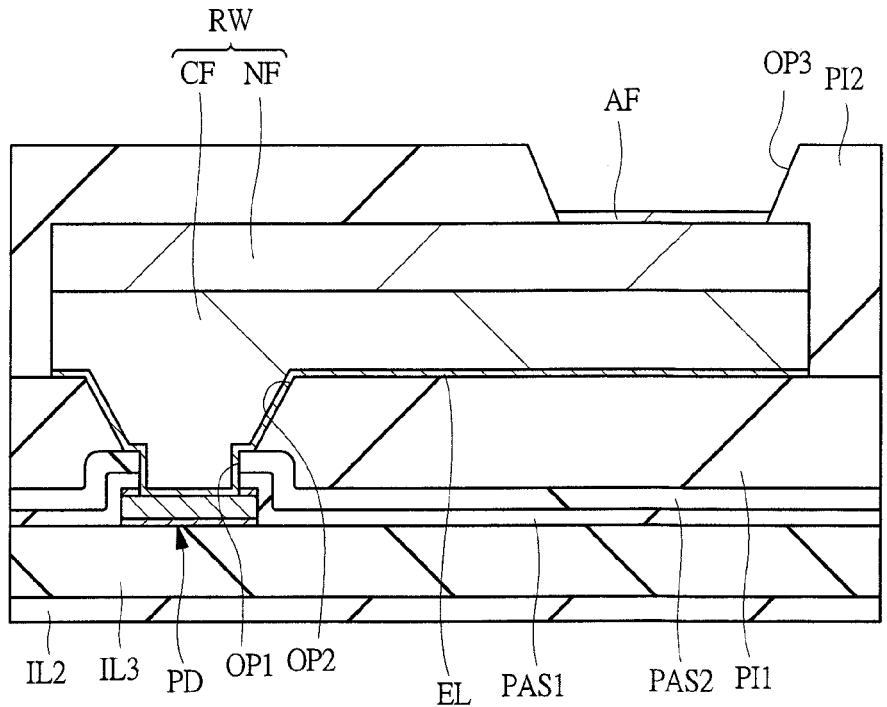
FIG. 28 is a cross-sectional view showing the manufacturing process of the semiconductor device continued from FIG. 27.

Next, as shown in FIG. 28, a gold film AF is formed on the rewiring RW (land) exposed through the opening OP3. The gold film AF can be formed by, for example, the electroless plating method.

Figure 29:
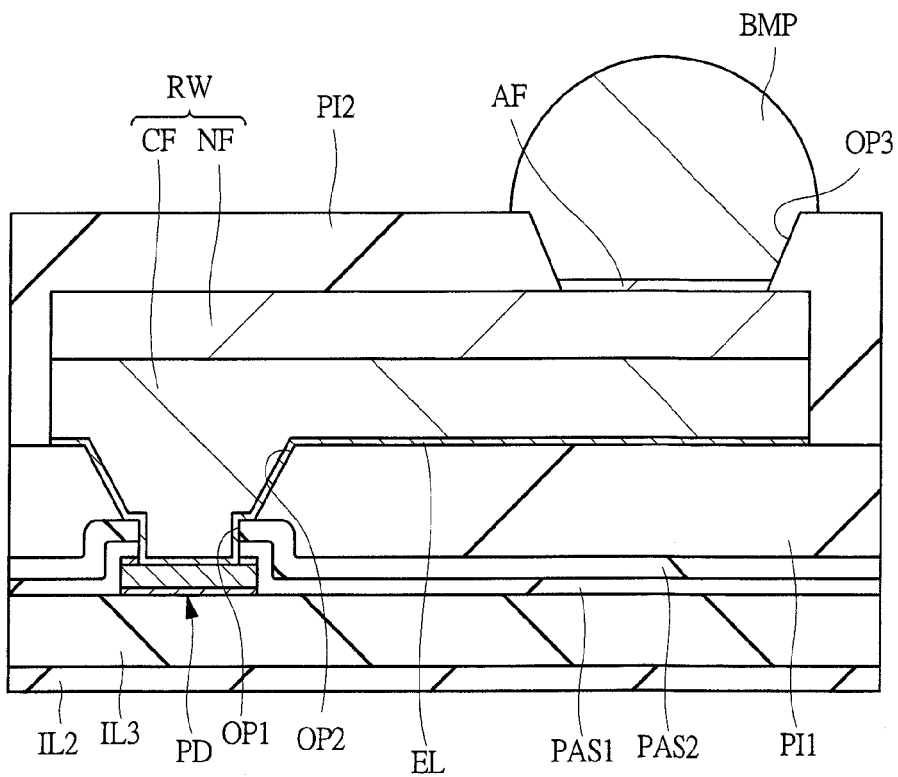
FIG. 29 is a cross-sectional view showing the manufacturing process of the semiconductor device continued from FIG. 28.

Subsequently, as shown in FIG. 29, solder paste is formed on the gold film AF formed in the opening OP3 by the solder printing method. Then, by performing the reflow (heat treatment) to the semiconductor wafer, the solder paste is shaped into the semispherical bump electrode BMP. In the above-described manner, for example, the rewiring RW can be formed in all of the chip regions of the semiconductor wafer, and the semiconductor wafer WF having the WPP structure as shown in FIG. 3 can be formed. More specifically, in the first embodiment, the bump electrodes BMP can be formed in each of the chip regions CR and the packaging can be completed in the state of the semiconductor wafer WF. After that, the process of polishing the rear surface of the semiconductor wafer WF is performed, and then, the process of cutting the semiconductor wafer WF along the dicing lines partitioning the chip regions CR of the semiconductor wafer WF is performed.

Figure 30:
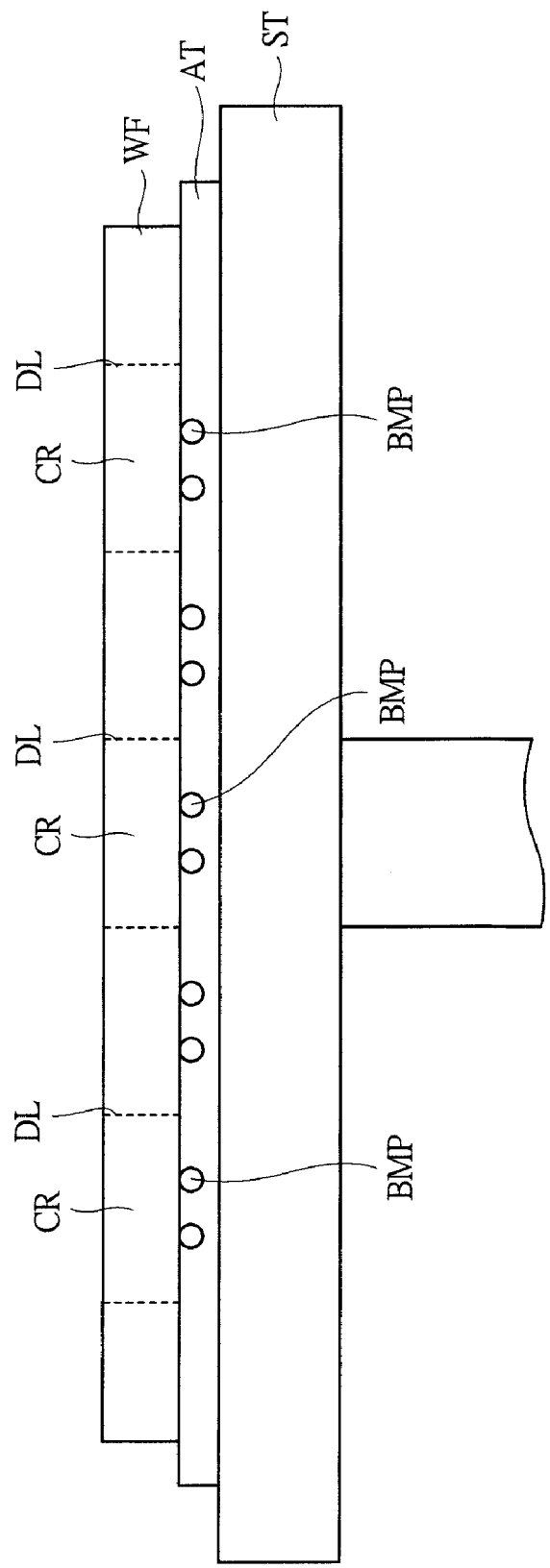
FIG. 30 is a cross-sectional view showing the manufacturing process of the semiconductor device continued from FIG. 29.

First, as shown in FIG. 30, the adhesive tape AT is attached onto the element forming surface of the semiconductor wafer WF. At this time, since the bump electrodes BMP are formed on the element forming surface of the semiconductor wafer WF, the adhesive tape AT is attached also to the bump electrodes BMP. Then, the semiconductor wafer WF is placed on the stage ST with the element forming surface of the semiconductor wafer WF being faced to the stage ST. More specifically, the semiconductor wafer WF is placed on the stage ST so that the element forming surface of the semiconductor wafer WF on which the bump electrodes BMP have been formed and the adhesive tape AT has been attached is adhered tightly to the stage ST. In this case, the rear surface of the semiconductor wafer WF is directed upward. At this time, as shown in FIG. 30, the plurality of chip regions CR partitioned by the dicing lines DL are formed in the semiconductor wafer WF, and the bump electrodes BMP are formed on the element forming surface of the chip regions. Also, the bump electrode BMP is not formed on the dicing lines DL.

Figure 31:
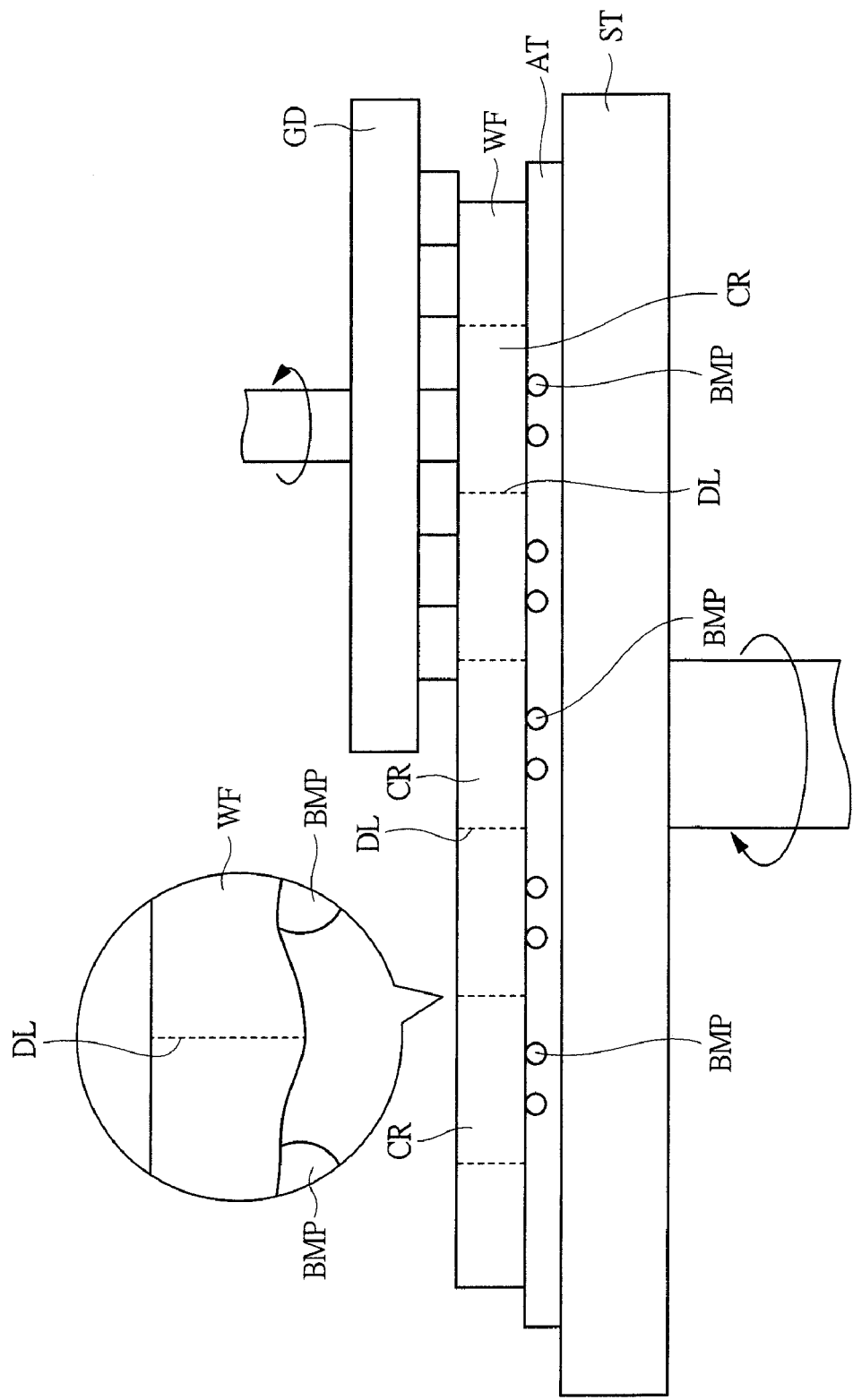
FIG. 31 is a cross-sectional view showing the manufacturing process of the semiconductor device continued from FIG. 30.

Next, as shown in FIG. 31, a grinder GD is pushed onto the rear surface of the semiconductor wafer WF directed upward to polish the rear surface of the semiconductor wafer WF. The thickness of the semiconductor wafer WF before the polishing is usually 500 μm to 700 μm. This semiconductor wafer WF is polished to a predetermined thickness (for example, 200 μm or less) while rotating both of the grinder GD and the stage ST (chuck table).

Here, the region in which the bump electrodes BMP are formed and the region in which the bump electrode BMP is not formed exist on the element forming surface of the semiconductor wafer WF. Therefore, there is the difference between the polishing pressure applied to the region in which the bump electrodes BMP are formed and the polishing pressure applied to the region in which the bump electrode BMP is not formed. More specifically, as shown in the enlarged view in FIG. 31, the warpage of the semiconductor wafer WF occurs on the dicing line DL, that is, in the region in which the bump electrode BMP is not formed. In other words, since the region in which the bump electrodes BMP are formed and the region in which the bump electrode BMP is not formed exist on the element forming surface of the semiconductor wafer WF, the polishing pressure applied to the semiconductor wafer WF becomes uneven. Therefore, when the rear surface of the semiconductor wafer WF is polished, the variation in thickness occurs in the semiconductor wafer WF as shown in the enlarged view in FIG. 31. Specifically, in the regions of the semiconductor wafer, the thickness of the semiconductor wafer is small in the inner region of the chip region CR in which the bump electrodes BMP are formed because the polishing pressure is high, and in contrast, the thickness of the semiconductor wafer is large on the dicing line DL in which the bump electrode BMP is not formed because the polishing pressure is low.

Figure 32:
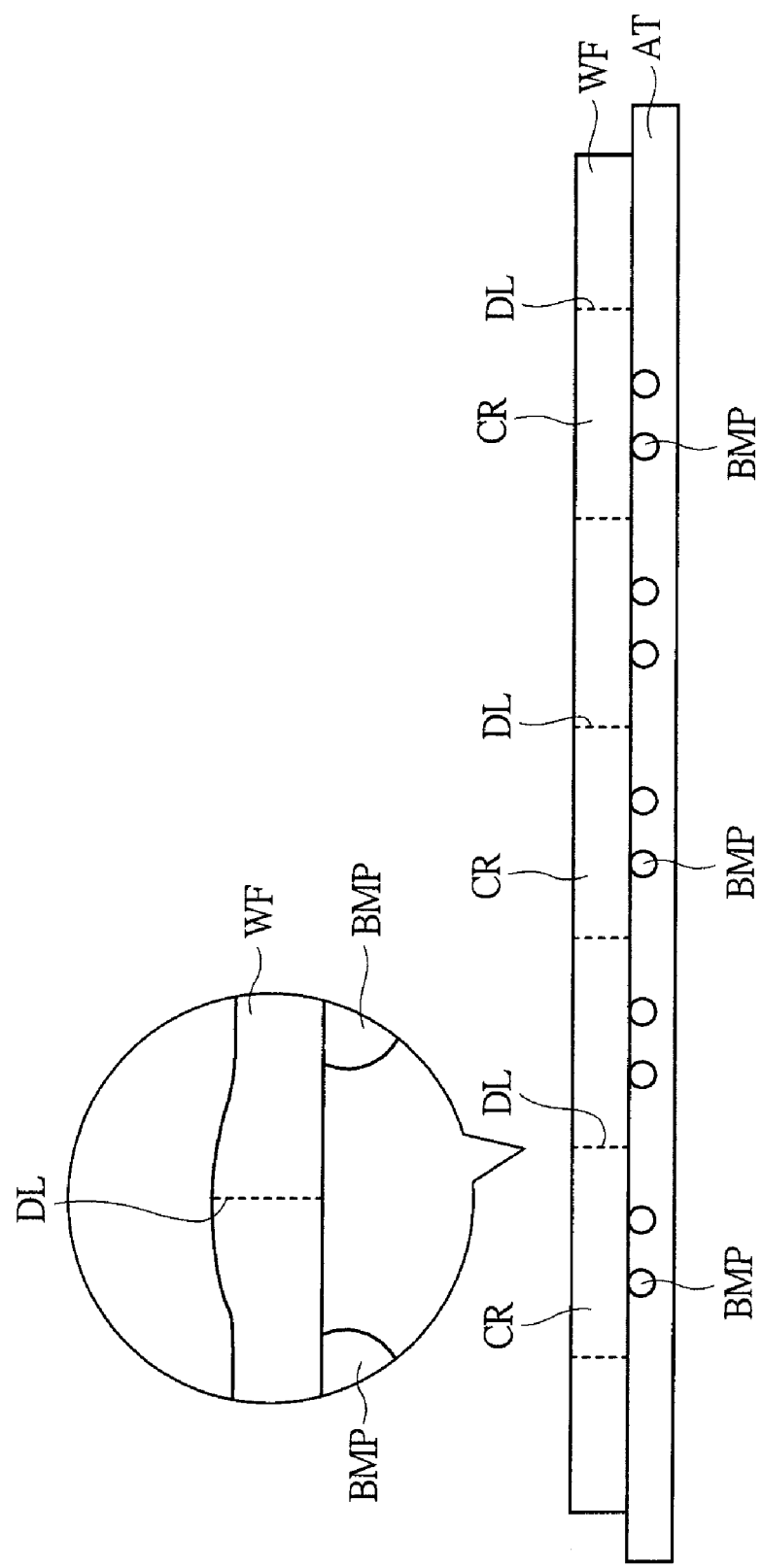
FIG. 32 is a cross-sectional view showing the manufacturing process of the semiconductor device continued from FIG. 31.

Thereafter, as shown in FIG. 32, the semiconductor wafer WF to which the adhesive tape AT has been attached is taken out from the stage ST. In this manner, the process of polishing the rear surface of the semiconductor wafer WF is completed. For example, by performing the process of polishing the rear surface of the semiconductor wafer WF, the thickness of the semiconductor wafer WF becomes 200 μm or less. Here, as shown in the enlarged view in FIG. 32, the variation in thickness occurs in the semiconductor wafer WF depending on the presence of the bump electrodes BMP. Specifically, as shown in the enlarged view in FIG. 32, the thickness on the dicing line DL in which the bump electrode BMP is not formed is larger than the thickness in the region in which the bump electrodes BMP are formed (inner region of the chip region CR).

Therefore, when the process of dicing the semiconductor wafer WF is performed after the process of polishing the rear surface of the semiconductor wafer WF, the stress distribution is generated in the semiconductor wafer WP due to the variation in thickness of the semiconductor wafer WF. Specifically, since the thickness of the semiconductor wafer WF on the dicing line DL is larger than the thickness of the semiconductor wafer WF in the adjacent region in which the bump electrodes BMP are formed, the semiconductor wafer WF on the dicing line DL has a convex shape. As a result, the tensile stress is generated in the dicing line DL. Therefore, when the trench is formed by the dicing cutter along the dicing line DL, the cracks are likely to be formed from the inside of the trench to the outside of the trench due to the tensile stress acting toward the outside from the inside of the trench. If the cracks as described above are formed, the individual pieces of the semiconductor chips diced from the semiconductor wafer WF become defective.

For its prevention, in the first embodiment, the process of dicing the semiconductor wafer WF is not performed immediately after performing the process of polishing the rear surface of the semiconductor wafer WF. Instead, the process of forming the trench in the rear surface of the semiconductor wafer WF is added between the process of polishing the rear surface of the semiconductor wafer WF and the process of dicing the semiconductor wafer WF. The first embodiment is characterized by performing the process of forming the trench in the rear surface of the semiconductor wafer WF. The process that characterizes the first embodiment will be described below.

Figure 33:
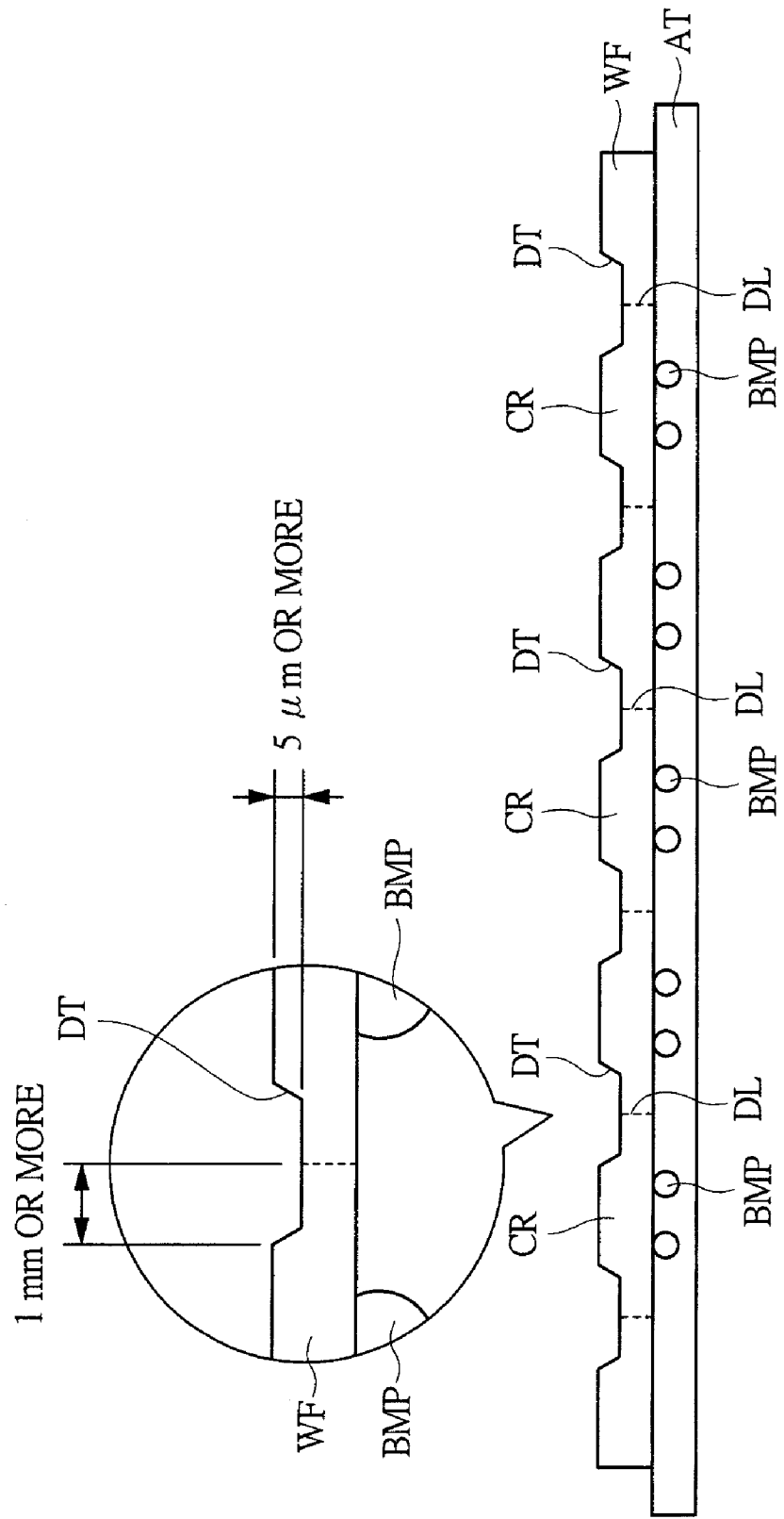
FIG. 33 is a cross-sectional view showing the manufacturing process of the semiconductor device continued from FIG. 32.

As shown in FIG. 33, in the state where the adhesive tape AT is attached onto the main surface (element forming surface) of the semiconductor wafer WF, the trench DT is formed in the rear surface of the semiconductor wafer WF. For forming the trench DT in the rear surface of the semiconductor wafer WF, a resist film is coated on the rear surface of the semiconductor wafer WF, and then, the resist film is patterned by using the photolithography technology. The resist film is patterned so as not to leave the resist film in the region in which the trench DT is to be formed. Then, by the dry etching technology using the patterned resist film as a mask, the trench DT is formed in the predetermined region of the semiconductor wafer WF. Specifically, the trench DT is formed in the region near the dicing line DL. In other words, although the thickness in the region near the dicing line DL is larger than the thickness in the region in which the bump electrodes BMP are formed as shown in the enlarged view in FIG. 32, by forming the trench DT in the region near the dicing line DL in this process, the thickness in the region near the dicing line DL can be made smaller than the thickness in the adjacent region in which the bump electrodes BMP are formed. As a result, the shape of the semiconductor wafer WF on the dicing line DL can be changed to a concave shape. Therefore, with respect to the case where the shape of the semiconductor wafer WF on the dicing line DL is the convex shape, the stress distribution applied to the semiconductor wafer can be changed. As described below, the stress on the dicing line DL can be changed from the tensile stress to the compressive stress by forming the trench DT on the dicing line DL of the semiconductor wafer WF. Therefore, it is possible to suppress the occurrence of the cracks in the dicing process.

As described above, the first embodiment is characterized in that the trench DT is formed in the region near the dicing line DL on the rear surface of the semiconductor wafer WF. By this means, the thickness of the semiconductor wafer WF in the region near the dicing line DL can be made smaller than the thickness of the semiconductor wafer WF in the other region in which the bump electrodes BMP are formed. As a result, the stress applied to the dicing line DL can be changed from the tensile stress to the compressive stress, and the occurrence of the cracks in the dicing can be prevented. In other words, in the first embodiment, the trench DT is formed in the region near the dicing line DL in order to change the stress applied onto the dicing line DL to the compressive stress.

In consideration of the above, the stress applied onto the dicing line DL can be effectively changed to the compressive stress by defining the region 1 mm or more from the dicing line DL as the region near the dicing line DL as shown in the enlarged view in FIG. 33. More specifically, the occurrence of the cracks in the dicing line DL can be effectively prevented by forming the trench DT ranging in the region 1 mm or more from the dicing line DL.

Further, from the viewpoint of effectively preventing the occurrence of the cracks by changing the stress applied onto the dicing line DL to the compressive stress, the depth of the trench DT formed in this process is desirably 5 μm or more.

Figure 34:
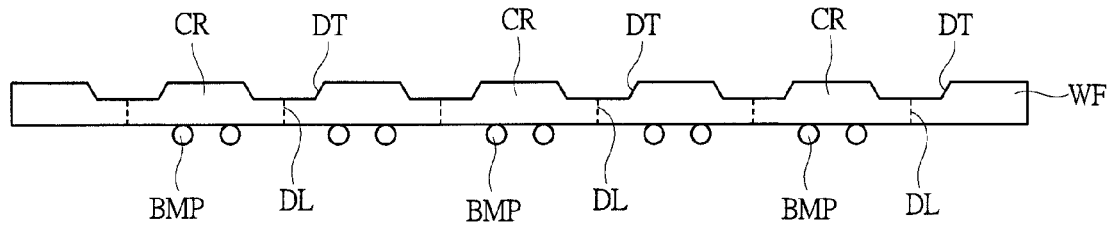
FIG. 34 is a cross-sectional view showing the manufacturing process of the semiconductor device continued from FIG. 33.

Thereafter, as shown in FIG. 34, the adhesive tape AT attached onto the element forming surface of the semiconductor wafer WF is removed as shown in FIG. 34. For example, when the adhesive tape AT is made of a material whose adhesive force is reduced by irradiating the ultraviolet, the adhesive tape AT is removed from the semiconductor wafer WF by irradiating the ultraviolet. Note that the process of removing the adhesive tape AT may be performed before the process of forming the trench DT in the rear surface of the semiconductor wafer WF.

Figure 35:
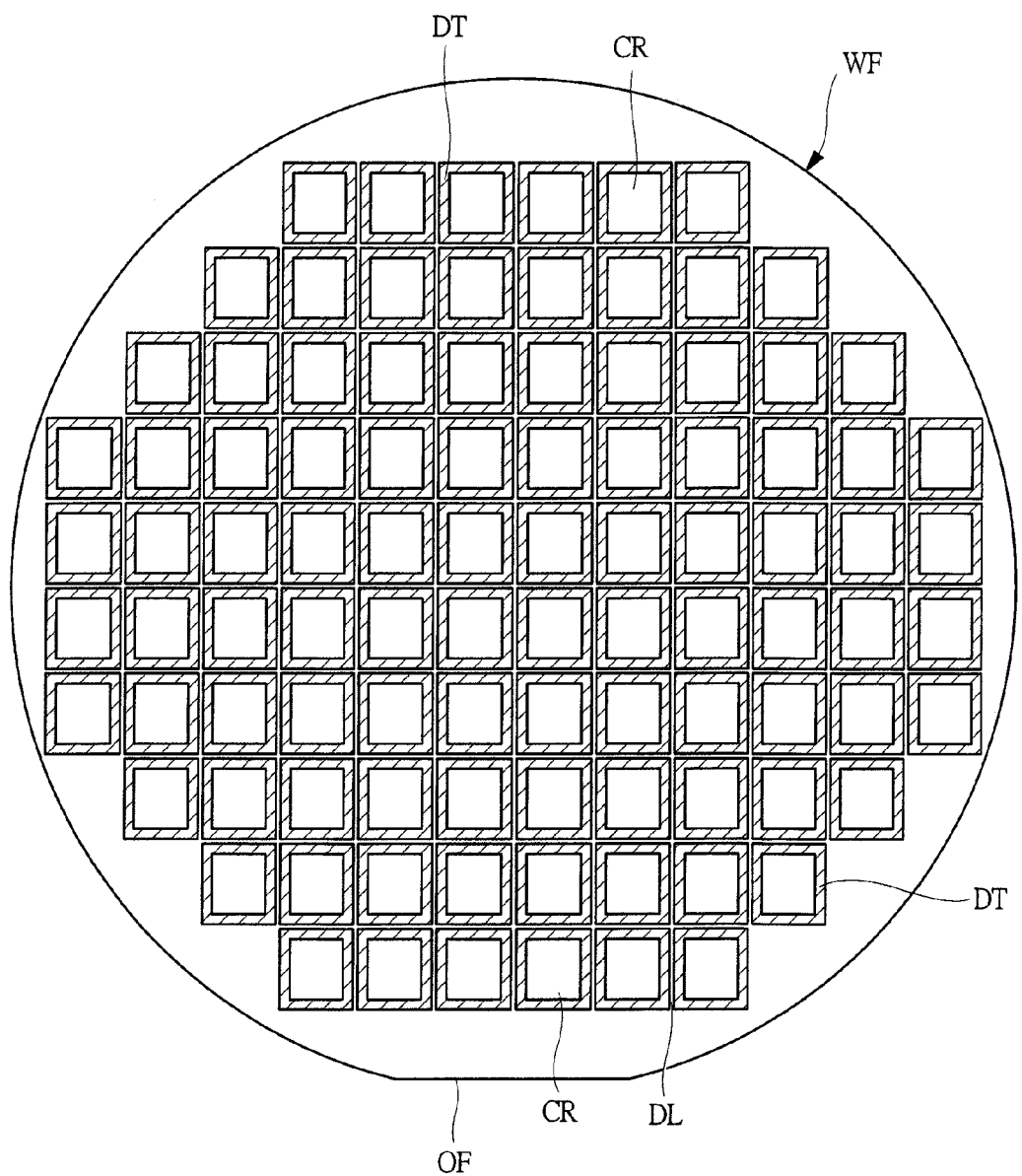
FIG. 35 is a diagram showing the semiconductor wafer.

In the manner described above, the trench DT can be formed in the region near the dicing line DL in the rear surface of the semiconductor wafer WF. FIG. 35 is a plan view showing the semiconductor wafer WF. In FIG. 35, the semiconductor wafer WF is partitioned by the dicing lines DL into the plurality of chip regions CR. At this time, the trenches DT are formed in the regions near the dicing lines DL. In the regions shown as the shaded areas in FIG. 35, the trenches DT are formed. Note that, in FIG. 35, in order to make the position to form the trench DT easily understood, the chip regions CR and the dicing lines DL formed on the main surface of the semiconductor wafer are shown, and the trenches DT formed in the rear surface of the semiconductor wafer WF are shown in the same plane. More specifically, the chip regions CR and the dicing lines DL are constituent elements formed on the main surface (element forming surface) of the semiconductor wafer WF, and the trenches DT are constituent elements formed on the rear surface of the semiconductor wafer WF.

Figure 36:
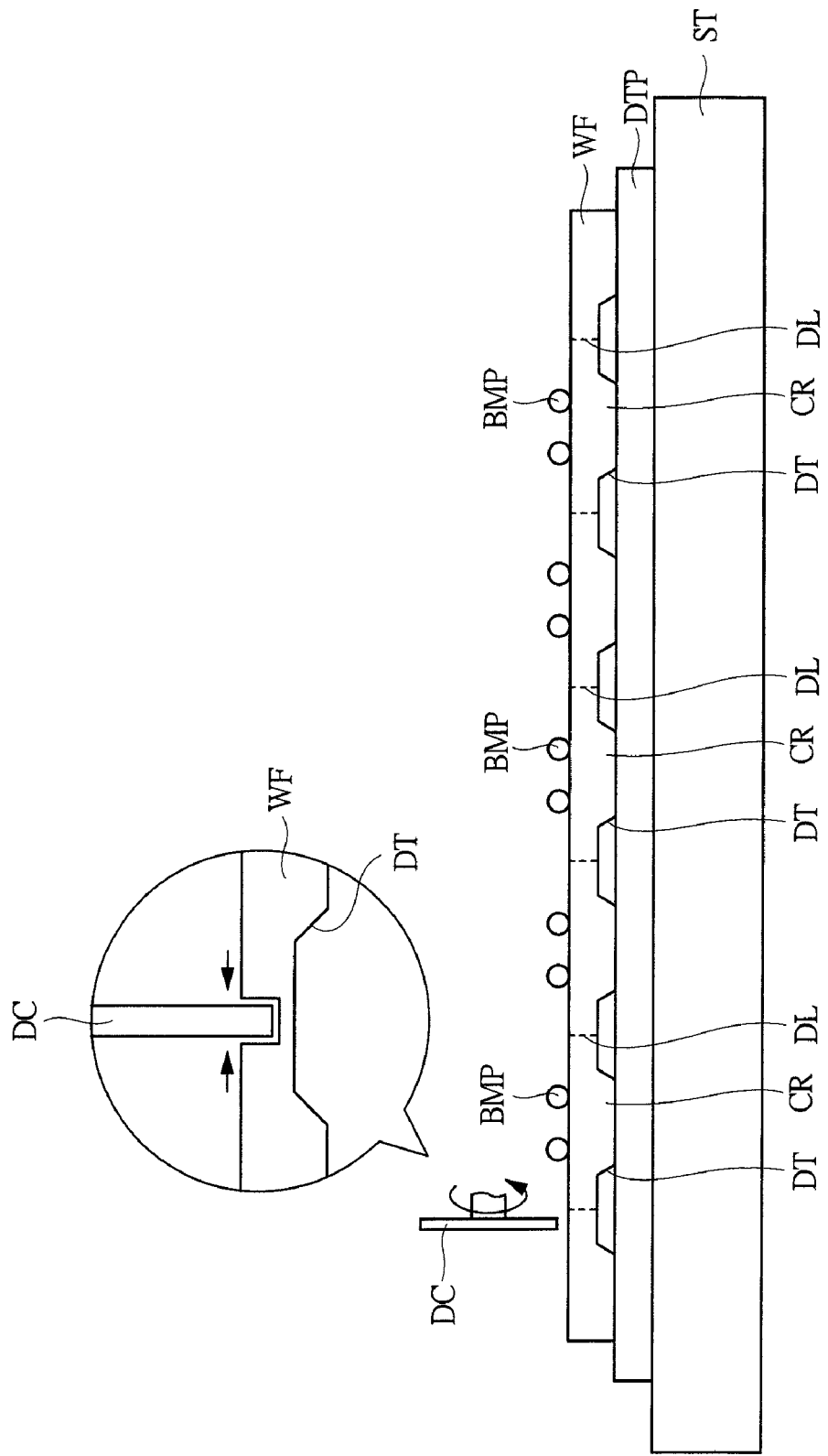
FIG. 36 is a cross-sectional view showing the manufacturing process of the semiconductor device continued from FIG. 34.

Next, by dicing the semiconductor wafer WF, the semiconductor wafer WF is cut into the individual pieces of the semiconductor chips. Specifically, as shown in FIG. 36, the dicing tape DTP is attached onto the rear surface of the semiconductor wafer WF, and the semiconductor wafer WF is fixed to the stage ST (chuck table) of the dicing apparatus. In other words, the rear surface of the semiconductor wafer WF to which the dicing tape DTP has been attached is faced to the stage ST, and the rear surface of the semiconductor wafer WF faced to the stage ST is fixed to the stage ST by the vacuum suction. In this manner, the main surface (element forming surface) of the semiconductor wafer WF on which the bump electrodes BMP are formed is directed upward. Then, the semiconductor wafer WF is cut by the dicing cutter DC along the dicing lines DL formed on the main surface (element forming surface) of the semiconductor wafer WF fixed to the stage ST.

At this time, as shown in the enlarged view in FIG. 36, the trench DT is formed in the rear surface of the dicing line DL, and the thickness of the semiconductor wafer WF on the dicing line DL is smaller than the thickness of the semiconductor wafer WF in the adjacent region. Therefore, when the semiconductor wafer WF is cut along the dicing line DL by the dicing cutter DC, the stress applied onto the dicing line DL can be changed from the tensile stress to the compressive stress. When the tensile stress is applied to the dicing line DL, since the stress is applied so as to strain toward the outside from the dicing trench, the cracks are likely to be formed toward the outside from the dicing trench when the dicing trench is formed. On the other hand, in the first embodiment, since the thickness in the region near the dicing line DL is made smaller than the thickness of the adjacent region, the surface on the dicing line DL has the concave shape. Accordingly, the compressive stress is applied to the dicing line DL. Since the compressive stress acts toward the inside of the dicing trench, the cracks toward the outside of the dicing trench formed in the dicing are unlikely to be formed. Therefore, in the first embodiment, it is possible to prevent the occurrence of the cracks in the semiconductor wafer WF when dicing the semiconductor wafer WF along the dicing line DL.

In particular, when the thickness of the semiconductor wafer WF is 200 μm or less, the cracks are likely to be formed in the semiconductor wafer WF by the dicing. In the first embodiment, however, since the trench DT is formed over the region 1 mm or more from the dicing line DL in the rear surface of the semiconductor wafer WF so as to correspond to the position of the dicing line DL and the depth of the trench DT is set to 5 μm or more, it is possible to effectively prevent the occurrence of the cracks in the semiconductor wafer WF.

Note that, in the dicing, the so-called two-step cutting in which the half cut is first formed in the semiconductor wafer WF with a wide dicing cutter (about 50 μm) and then the semiconductor wafer WF is cut with a narrower dicing cutter (about 30 μm) is performed in some cases. In this case, a step is formed in the dicing line due to the half cut. However, the trench DT in the first embodiment should be clearly distinguished from the step due to the half cut. More specifically, while the trench DT in the first embodiment is formed in the rear surface of the semiconductor wafer WF, the step due to the half cut is formed in the main surface of the semiconductor wafer WF. Further, as an obvious difference, the trench DT in the first embodiment is the large trench formed over the region 1 mm or more from the dicing line DL. On the other hand, since the width of the step due to the half cut is about 50 μm as described above, the step is formed only in the region about 25 μm from the dicing line DL in the lateral direction. Therefore, the trench DT in the first embodiment and the step due to the half cut have a large difference in size. In other words, the trench DT formed in the rear surface of the semiconductor wafer WF so as to correspond to the position of the dicing line DL is formed over the region 1 mm or more from the dicing line DL from the viewpoint of effectively preventing the cracks formed in the dicing, and thus, the occurrence of the cracks formed in the dicing can be effectively prevented.

Figure 37:
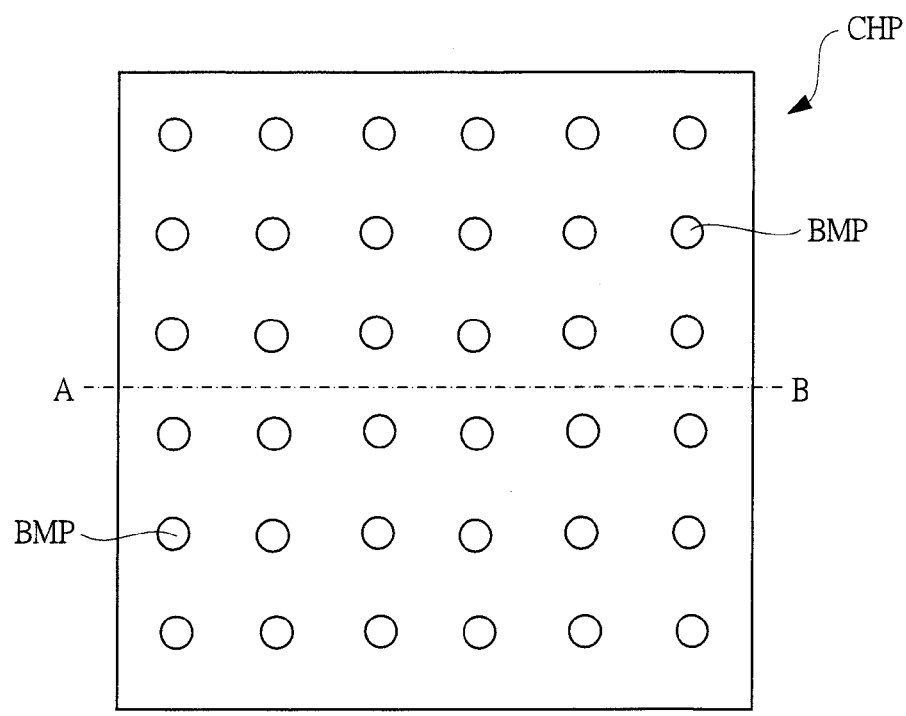
FIG. 37 is a diagram showing the semiconductor chip in the first embodiment.

By cutting the semiconductor wafer WF in the manner described above, the individual pieces of the semiconductor chips can be obtained. FIG. 37 is a plan view showing the semiconductor chip CHP obtained by cutting the semiconductor wafer WF into pieces. As shown in FIG. 37, the semiconductor chip CHP has a quadrangular shape (rectangular shape), and the plurality of bump electrodes BMP are arranged in an array (matrix) on the surface of the semiconductor chip CHP. The four sides corresponding to the edge portions of the semiconductor chip CHP are formed by cutting the dicing lines DL formed on the semiconductor wafer WF. At this time, in the first embodiment, the trench DT is formed in the rear surface of the semiconductor wafer WF so as to correspond to the position of the dicing line DL as shown in FIG. 36, and when the semiconductor wafer WF is cut into pieces of the semiconductor chips CHP, the trenches DT are left as remains in the edge portions of the semiconductor chip CHP. The remains formed in the semiconductor chip CHP will be described below.

Figure 38:
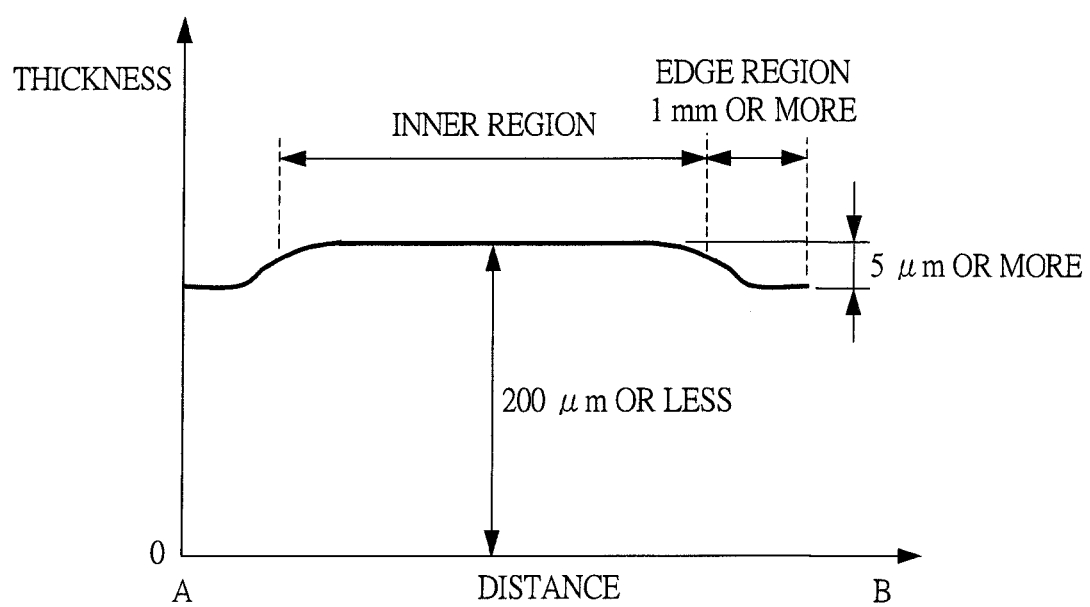
FIG. 38 is a diagram showing the thickness distribution of the semiconductor chip cut along the line A-B in FIG. 37.

FIG. 38 is a diagram showing the thickness distribution of the semiconductor chip CHP cut along the line A-B in FIG. 37. In FIG. 38, the horizontal axis represents the position (distance) form the point A and the vertical axis represents the thickness of the semiconductor chip CHP at the respective positions. It can be understood from FIG. 38 that the thickness in the edge regions of the semiconductor chip CHP is smaller than the thickness in the inner region of the semiconductor chip CHP. The edge region of the semiconductor chip CHP mentioned here includes at least the region 1 mm or more from the edge portion of the semiconductor chip CHP. On the other hand, the inner region of the semiconductor chip CHP corresponds to the region inside the edge regions mentioned above. As shown in FIG. 38, the thickness in the inner region of the semiconductor chip CHP is 200 μm or less, and the thickness in the edge regions of the semiconductor chip CHP is smaller than the thickness in the inner region. Specifically, the thickness in the edge regions is smaller by 5 μm or more than the thickness in the inner region.

The reason why there is the thickness distribution in the thickness in the inner region of the semiconductor chip CHP and the thickness in the edge regions of the semiconductor chip CHP is that the trench DT is formed in the rear surface of the semiconductor wafer WF so as to correspond to the position of the dicing line DL of the semiconductor wafer WF as described above. More specifically, the thickness distribution is provided in the regions of each piece of the semiconductor chip CHP due to the trench DT formed so as to correspond to the position of the dicing line DL. For example, since the dicing line DL in the semiconductor wafer WF is to be the edge portion of the semiconductor chip CHP, the thickness of the semiconductor chip CHP is reduced from the edge portion over the predetermined region (edge region) in the semiconductor chip CHP due to the trench DT formed in the region near the dicing line DL. As described above, the first embodiment is characterized in that the dicing is performed in the state where the trench DT is formed in the region near the dicing line DL in the semiconductor wafer WF, and due to the characteristics in the manufacturing process, the remains that the thickness in the edge regions becomes smaller than the thickness in the inner region are left in the manufactured semiconductor chip CHP. In the manner described above, the semiconductor device in the first embodiment can be manufactured.

In the first embodiment, for example, the trench DT is formed in the rear surface of the semiconductor wafer WF so as to correspond to the position of the dicing line DL in the semiconductor wafer WF, so that the thickness in the region near the dicing line DL is made smaller than the thickness of the other region in which the bump electrodes BMP are formed as shown in FIG. 36. By this means, in the dicing, the region in which the dicing line DL is formed can have the concave shape. Although it has been described in the first embodiment that the stress applied onto the dicing line DL can be changed from the tensile stress to the compressive stress by means of this structure, the validity of the assumption that the compressive stress is applied to the dicing trench when the thickness in the region near the dicing line DL is reduced will be described below by actually performing the stress simulation.

Figure 39:
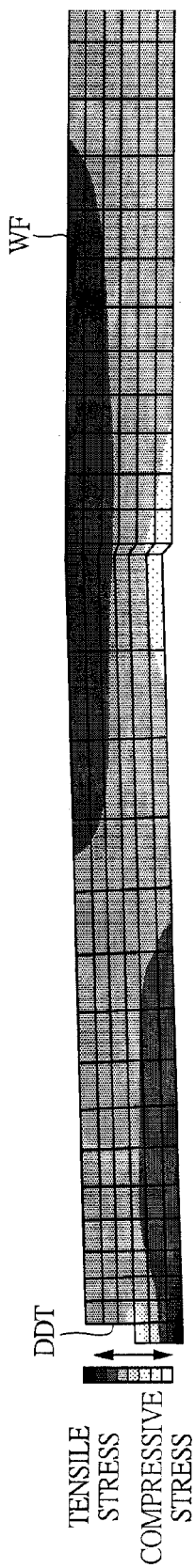
FIG. 39 is a diagram showing the result of the analysis of the stress distribution applied to the semiconductor wafer by the vacuum suction force of the stage in the dicing process.

FIG. 39 is a diagram showing the result of the analysis of the stress distribution applied to the semiconductor wafer WF by the vacuum suction force of the stage (chuck table) in the dicing process. FIG. 39 shows the stress distribution in the case where the dicing is performed in the state where the thickness in the dicing region (region near the dicing line) is made smaller than that of the other region. In FIG. 39, the stress distribution in the case where the trench DDT is formed in the dicing region of the semiconductor wafer WF is shown. It can be understood from FIG. 39 that the compressive stress is applied to the region close to the bottom and corner portions of the trench DDT. More specifically, it can be understood from the result shown in FIG. 39 that the compressive stress is applied to the trench DDT formed in the dicing region when the thickness of the dicing region of the semiconductor wafer WF is smaller than that of the other region. This means that the cracks are unlikely to be formed toward the outside from the trench DDT when the thickness of the dicing region of the semiconductor wafer WF is smaller than that of the other region. Accordingly, it can be said that the characteristics of the first embodiment that the thickness in the region near the dicing line DL is made smaller than the thickness of the other region in which the bump electrodes BMP are formed are reasonable from the viewpoint of preventing the occurrence of the cracks formed in the dicing.

Second Embodiment

The structure in which the thickness of the region near the dicing line DL is made smaller than the thickness of the other region in which the bump electrodes BMP are formed by forming the trench DT in the rear surface of the semiconductor wafer WF in the region near the dicing line DL has been described in the first embodiment. In the second embodiment, the technology for preventing the occurrence of the cracks in the dicing by devising the arrangement of the bump electrodes BMP formed on the semiconductor chip CHP (chip region CR in the state of the semiconductor wafer WF) will be described. Although the following description is premised on the structure in the chip region CR of the semiconductor wafer WF, this structure will be described as that of the individual pieces of the semiconductor chip CHP.

Figure 40:
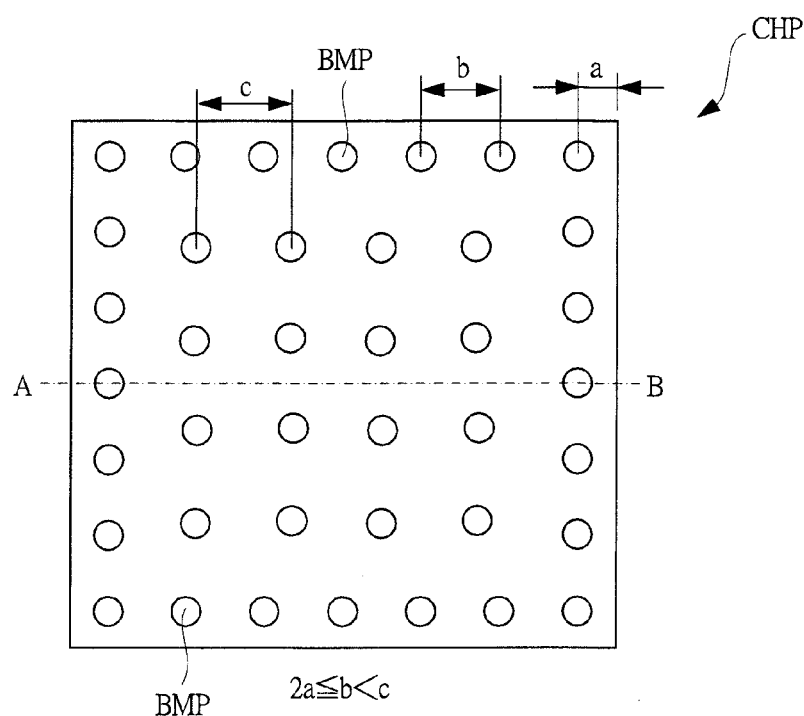
FIG. 40 is a diagram showing the semiconductor chip in the second embodiment.

FIG. 40 is a diagram showing the structure of the semiconductor chip CHP in the second embodiment. As shown in FIG. 40, the semiconductor chip CHP in the second embodiment has a quadrangular shape (rectangular shape), and the plurality of bump electrodes BMP are formed on the inner surface of the semiconductor chip CHP. The second embodiment is characterized in that the distance between the bump electrodes BMP formed in the outermost periphery of the semiconductor chip CHP (distance b in FIG. 40) is made smaller than the distance between the bump electrodes BMP formed in the inner region (region other than the outermost periphery) of the semiconductor chip CHP (distance c in FIG. 40) and the distance between the bump electrodes BMP formed in the outermost periphery of the semiconductor chip CHP (distance b in FIG. 40) is made twice or more as large as the distance from the edge portion of the semiconductor chip CHP to the bump electrode BMP of the outermost periphery (distance a in FIG. 40). By this means, the density of the bump electrodes BMP in the edge region of the semiconductor chip CHP can be made higher than the density of the bump electrodes BMP in the inner region (internal region) of the semiconductor chip CHP. In other words, by increasing the density of the bump electrodes BMP formed in the region near the edge portion of the semiconductor chip CHP, the polishing pressure in the region near the dicing line in the polishing process of the semiconductor wafer WF can be increased.

That is, although the description is made in FIG. 40 as the structure of the semiconductor chip CHP, if this structure is viewed in the state of the semiconductor wafer WF before the dicing into individual pieces of the semiconductor chips CHP, it means that the density of the bump electrodes BMP near the dicing line DL of the semiconductor wafer WF is increased, and this means that the polishing pressure is increased in the region near the dicing line DL in the process of polishing the rear surface of the semiconductor wafer WF. More specifically, even on the dicing line DL in which the bump electrode BMP is not formed, by increasing the density of the bump electrodes BMP in the region near the dicing line DL, the thickness of the semiconductor wafer WF on the dicing line DL can be made smaller than the thickness of the semiconductor wafer WF in the other inner region in which the bump electrodes BMP are formed. As a result, also in the second embodiment, the stress applied onto the dicing line DL can be changed from the tensile stress to the compressive stress, and the cracks formed in the semiconductor wafer WF can be reduced. In other words, in the second embodiment, by devising the arrangement of the bump electrodes BMP as described above, the trench DT in the region near the dicing line DL similar to that of the first embodiment can be formed.

Also in the second embodiment, the four sides corresponding to the edge portions of the semiconductor chip CHP are formed by cutting the dicing lines DL formed on the semiconductor wafer WF. At this time, also in the second embodiment, the trench DT is formed in the rear surface of the semiconductor wafer WF so as to correspond to the position of the dicing line DL as shown in FIG. 36, and when the semiconductor wafer WF is cut into pieces of the semiconductor chips CHP, the trenches DT are left as remains in the edge portions of the semiconductor chip CHP. The remains formed in the semiconductor chip CHP will be described below.

Figure 41:
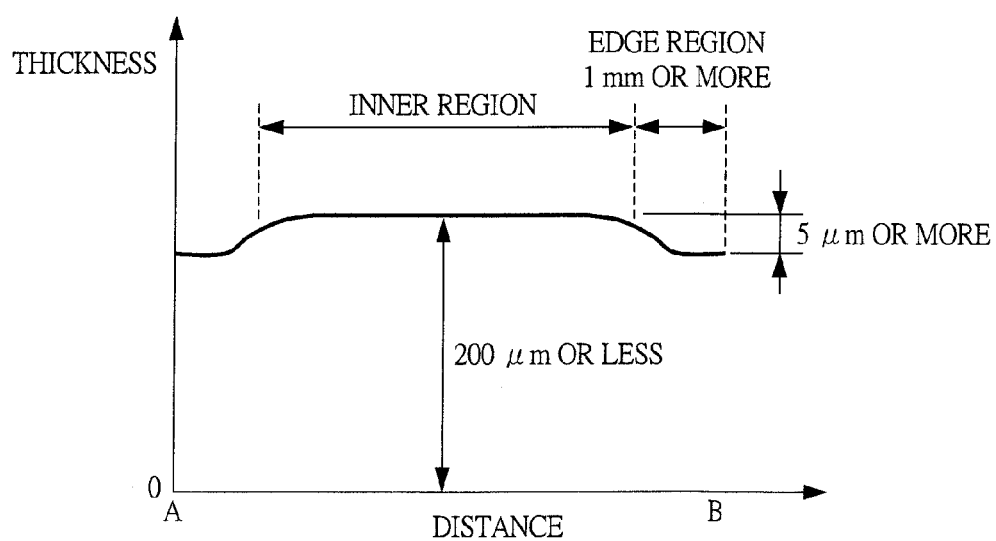
FIG. 41 is a diagram showing the thickness distribution of the semiconductor chip cut along the line A-B in FIG. 40.

FIG. 41 is a diagram showing the thickness distribution of the semiconductor chip CHP cut along the line A-B in FIG. 40. In FIG. 41, the horizontal axis represents the position (distance) form the point A and the vertical axis represents the thickness of the semiconductor chip CHP at the respective positions. It can be understood from FIG. 41 that the thickness in the edge regions of the semiconductor chip CHP is smaller than the thickness in the inner region of the semiconductor chip CHP. The edge region of the semiconductor chip CHP mentioned here includes at least the region 1 mm or more from the edge portion of the semiconductor chip CHP. On the other hand, the inner region of the semiconductor chip CHP corresponds to the region inside the edge regions mentioned above. As shown in FIG. 41, the thickness in the inner region of the semiconductor chip CHP is 200 µm or less, and the thickness in the edge regions of the semiconductor chip CHP is smaller than the thickness in the inner region. Specifically, the thickness in the edge regions is smaller by 5 µm or more than the thickness in the inner region.

The reason why there is the thickness distribution in the thickness in the inner region of the semiconductor chip CHP and the thickness in the edge regions of the semiconductor chip CHP is that the trench DT is formed in the rear surface of the semiconductor wafer WF so as to correspond to the position of the dicing line DL of the semiconductor wafer WF as described above. More specifically, the thickness distribution is provided in the regions of each piece of the semiconductor chip CHP due to the trench DT formed so as to correspond to the position of the dicing line DL. For example, since the dicing line DL in the semiconductor wafer WF is to be the edge portion of the semiconductor chip CHP, the thickness of the semiconductor chip CHP is reduced from the edge portion over the predetermined region (edge region) in the semiconductor chip CHP due to the trench DT formed in the region near the dicing line DL.

Figure 42:
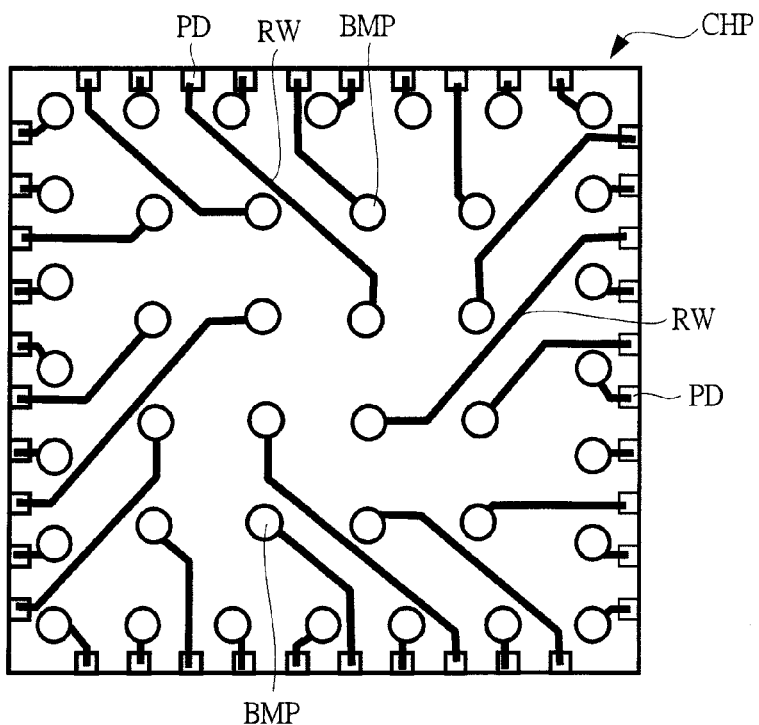
FIG. 42 is a diagram showing the WPP structure of the semiconductor chip in the second embodiment.

Next, the WPP structure of the semiconductor chip CHP in the second embodiment will be described. FIG. 42 is a diagram showing the WPP structure of the semiconductor chip CHP in the second embodiment. As shown in FIG. 42, the semiconductor chip CHP in the second embodiment has a rectangular shape, and the pads PD are formed along the four sides of the semiconductor chip CHP. Also, the pads PD and the bump electrodes BMP formed on the surface of the semiconductor chip CHP are connected by the rewirings RW. At this time, in the second embodiment, the distance between the bump electrodes BMP disposed in the outermost periphery is smaller than the distance between the bump electrodes BMP disposed in the inner region inside the outermost periphery, and even in this case, all of the pads PD and all of the bump electrodes BMP can be electrically connected to each other by the rewirings RW by devising the layout of the rewirings RW as shown in FIG. 42. Note that the manufacturing method of the semiconductor device in the second embodiment is the same as that of the first embodiment other than that the positions to form the bump electrodes BMP (layout structure) are changed.

Third Embodiment

In the third embodiment, an example in which dummy bump electrodes are formed will be described. Although the following description is premised on the structure in the chip region CR of the semiconductor wafer WF, this structure will be described as that of the individual pieces of the semiconductor chip CHP.

Figure 43:
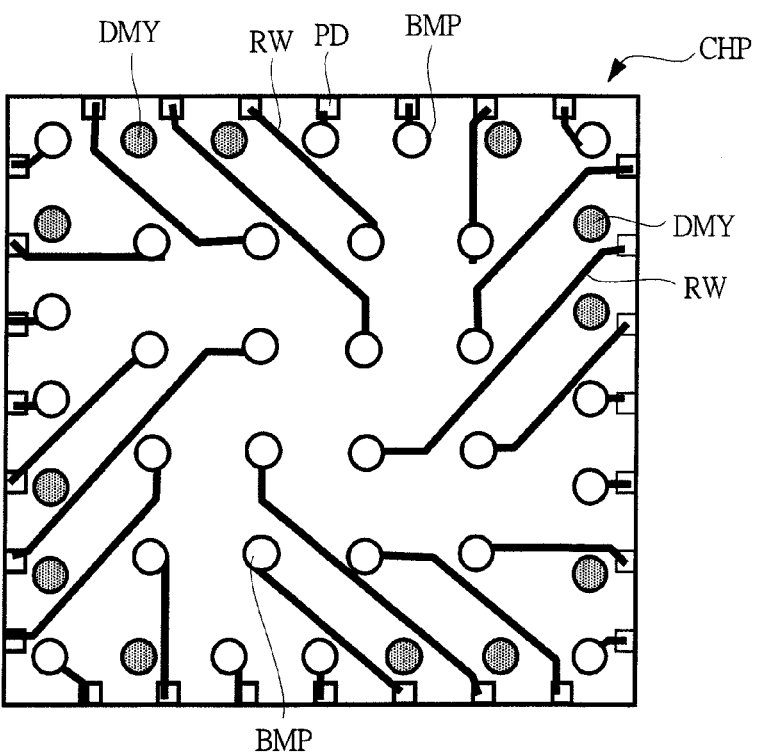
FIG. 43 is a diagram showing the semiconductor chip in the third embodiment.

FIG. 43 is a diagram showing the structure of the semiconductor chip CHP in the third embodiment. In FIG. 43, the bump electrodes BMP electrically connected to the pads PD by the rewirings RW and dummy bump electrodes DMY electrically isolated are formed in the semiconductor chip CHP in the third embodiment. For example, there can be the case where only the bump electrodes BMP electrically connected to the pads PD through the rewirings RW are actually formed in FIG. 43. In this case, for example, the density of the bump electrodes BMP becomes low in the region near the edge portion of the semiconductor chip CHP. That is, although the description is made in FIG. 43 as the structure of the semiconductor chip CHP, if this structure is viewed in the state of the semiconductor wafer WF before the dicing into individual pieces of the semiconductor chips CHP, it means that the density of the bump electrodes BMP near the dicing line DL of the semiconductor wafer WF is decreased, and this means that the polishing pressure is decreased in the region near the dicing line DL in the process of polishing the rear surface of the semiconductor wafer WF. More specifically, since the density of the bump electrodes BMP is low in the region near the dicing line DL on which the bump electrode BMP is not formed, the warpage of the semiconductor wafer WF occurs on the dicing line DL, and the thickness of the semiconductor wafer WF on the dicing line DL becomes larger than the thickness of the semiconductor wafer WF in the other inner region in which the bump electrodes BMP are formed. As a result, when the semiconductor wafer WF is cut by the dicing cutter DC along the dicing line DL, since the variation in thickness of the semiconductor wafer WF is large, the tensile stress generated in the dicing trench is increased and the occurrence of the cracks becomes obvious.

Therefore, in the third embodiment, as shown in FIG. 43, the dummy bump electrodes DMY are formed in the region near the edge portion of the semiconductor chip CHP. By this means, the density of the bump electrodes BMP in the edge region of the semiconductor chip CHP can be made higher than that of the case where the dummy bump electrode DMY is not formed. In other words, by increasing the density of the bump electrodes BMP and the dummy bump electrodes DMY formed in the region near the edge portion of the semiconductor chip CHP, the polishing pressure in the region near the dicing line DL in the polishing process of the semiconductor wafer WF can be increased.

That is, although the description is made in FIG. 43 as the structure of the semiconductor chip CHP, if this structure is viewed in the state of the semiconductor wafer WF before the dicing into individual pieces of the semiconductor chips CHP, it means that the density of the bump electrodes BMP near the dicing line DL of the semiconductor wafer WF is increased, and this means that the polishing pressure is increased in the region near the dicing line DL in the process of polishing the rear surface of the semiconductor wafer WF. More specifically, even on the dicing line DL in which the bump electrode BMP is not formed, by increasing the density of the bump electrodes BMP and the dummy bump electrodes DMY in the region near the dicing line DL, the thickness of the semiconductor wafer WF on the dicing line DL can be made smaller than the thickness of the semiconductor wafer WF in the other inner region in which the bump electrodes BMP are formed. As a result, also in the third embodiment, the stress applied onto the dicing line DL can be changed from the tensile stress to the compressive stress, and the cracks formed in the semiconductor wafer WF can be reduced. In other words, in the third embodiment, by forming the dummy bump electrodes DMY as described above, the trench DT in the region near the dicing line DL similar to that of the first embodiment can be formed.

Figure 44:
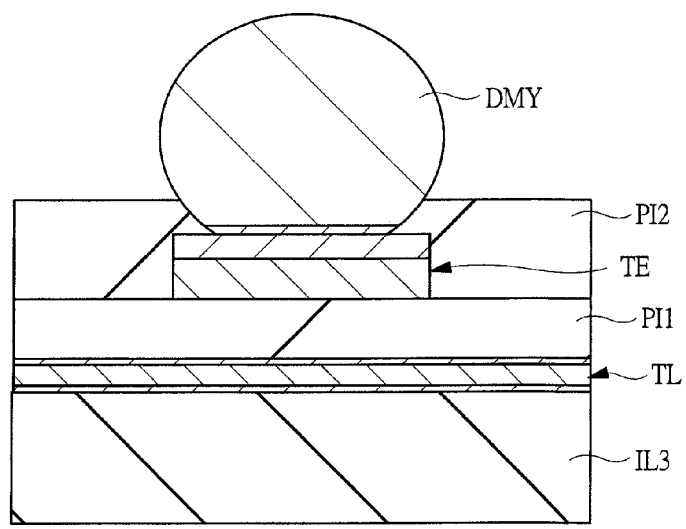
FIG. 44 is a cross-sectional view showing an example of the cross-sectional structure of the dummy bump electrode.

Next, the structure of the dummy bump electrode DMY will be described. FIG. 44 is a cross-sectional view showing the structure of the dummy bump electrode DMY in the third embodiment. In FIG. 44, a top layer wiring TL is formed on the interlayer insulating film IL3. Also, the polyimide resin film PI1 is formed on the top layer wiring TL, and the terminal TE is formed on this polyimide resin film PI1. The polyimide resin film PI2 is formed so as to cover the polyimide resin film PI1 on which the terminal TE has been formed, and the dummy bump electrode DMY is formed in the opening formed in the polyimide resin film PI2. More specifically, the dummy bump electrode DMY is formed on the terminal TE exposed through the opening formed in the polyimide resin film PI2. At this time, the terminal TE connected to the dummy bump electrode DMY is formed in the same layer as the rewiring. Therefore, the dummy bump electrode DMY formed on the terminal TE formed in the same layer as the rewiring is formed in the same layer as the normal bump electrode connected to the rewiring. Also, the terminal TE connected to the dummy bump electrode DMY is not connected to the wiring and is electrically isolated. Accordingly, it can be said that the dummy bump electrode DMY formed on the terminal TE is also electrically isolated.

Here, the dummy bump electrodes DMY and the rewirings RW are laid out so as not to be in contact with each other in FIG. 43, but actually, the rewiring RW connected to the normal bump electrode BMP is disposed in some cases in the lower layer of the position where the dummy bump electrode DMY is formed when the dummy bump electrode DMY is formed in a free space of the semiconductor chip CHP. In this case, for example, the dummy bump electrode DMY having the structure as shown in FIG. 44 cannot be formed because the rewiring RW and the dummy bump electrode DMY are connected.

Figure 45:
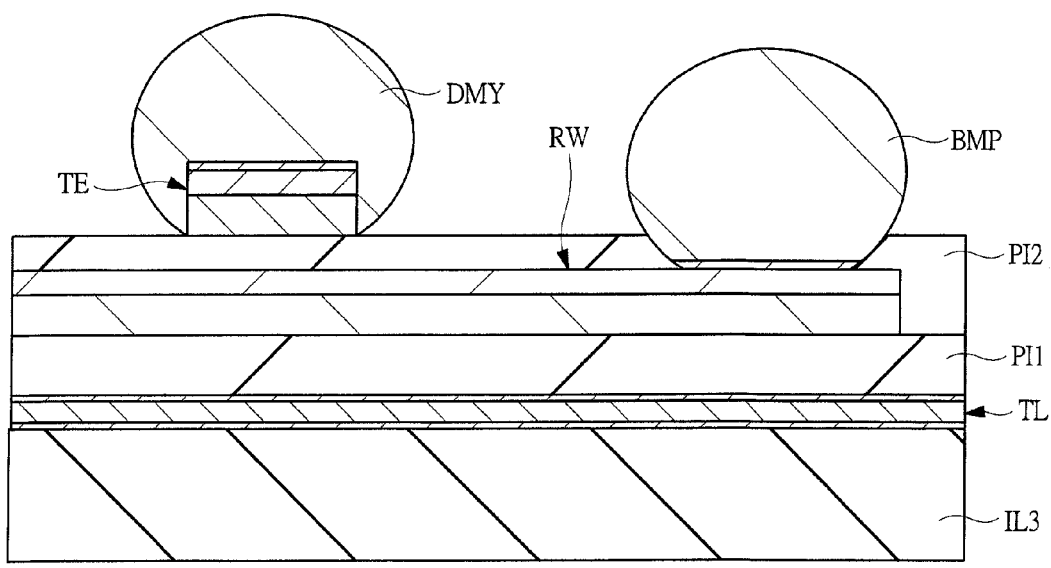
FIG. 45 is a cross-sectional view showing another example of the cross-sectional structure of the dummy bump electrode.

So, the example of forming the dummy bump electrode DMY not connected to the rewiring RW even when the rewiring RW is formed in the lower layer of the dummy bump electrode DMY will be described with reference to FIG. 45. FIG. 45 is a cross-sectional view showing another structure of the dummy bump electrode DMY in the third embodiment. In FIG. 45, the top layer wiring TL is formed on the interlayer insulating film IL3. Also, the polyimide resin film PI1 is formed on the top layer wiring TL, and the rewiring RW is formed on this polyimide resin film PI1. The polyimide resin film PI2 is formed so as to cover the polyimide resin film PI1 on which the rewiring RW has been formed, and the opening through which one end of the rewiring RW is exposed is formed in this polyimide resin film PI2. The bump electrode BMP is formed in the opening through which the one end of the rewiring RW is exposed. On the other hand, the terminal TE is formed on the polyimide resin film PI2, and the dummy bump electrode DMY is formed on this terminal TE. As described above, by forming the rewiring RW on the polyimide resin film PI1 and forming the terminal TE on the polyimide resin film PI2, the rewiring RW and the terminal TE can be electrically isolated. This means that the bump electrode BMP and the dummy bump electrode DMY can be electrically isolated even when the rewiring RW is formed in the lower layer of the dummy bump electrode DMY. More specifically, by forming the bump electrode BMP and the dummy bump electrode DMY in the different planes (on the polyimide resin film PI1 and on the polyimide resin film PI2), the bump electrode BMP and the dummy bump electrode DMY can be electrically isolated even when the rewiring RW is formed in the lower layer of the dummy bump electrode DMY. By forming the dummy bump electrode DMY having the above-described structure, the degree of freedom of the layout for disposing the dummy bump electrodes DMY can be increased. Note that the manufacturing method of the semiconductor device in the third embodiment is the same as that of the first embodiment other than that the dummy bump electrodes DMY are formed.

Fourth Embodiment

In the fourth embodiment, an example in which the dummy bump electrode DMY is formed also on the dicing line DL of the semiconductor wafer WF will be described. The manufacturing method of the semiconductor device in the fourth embodiment will be described below. The process shown in FIG. 16 to FIG. 29 is almost the same as that of the first embodiment. The difference lies in the point that the dummy bump electrode DMY is formed on the dicing line DL of the semiconductor wafer WF.

Figure 46:
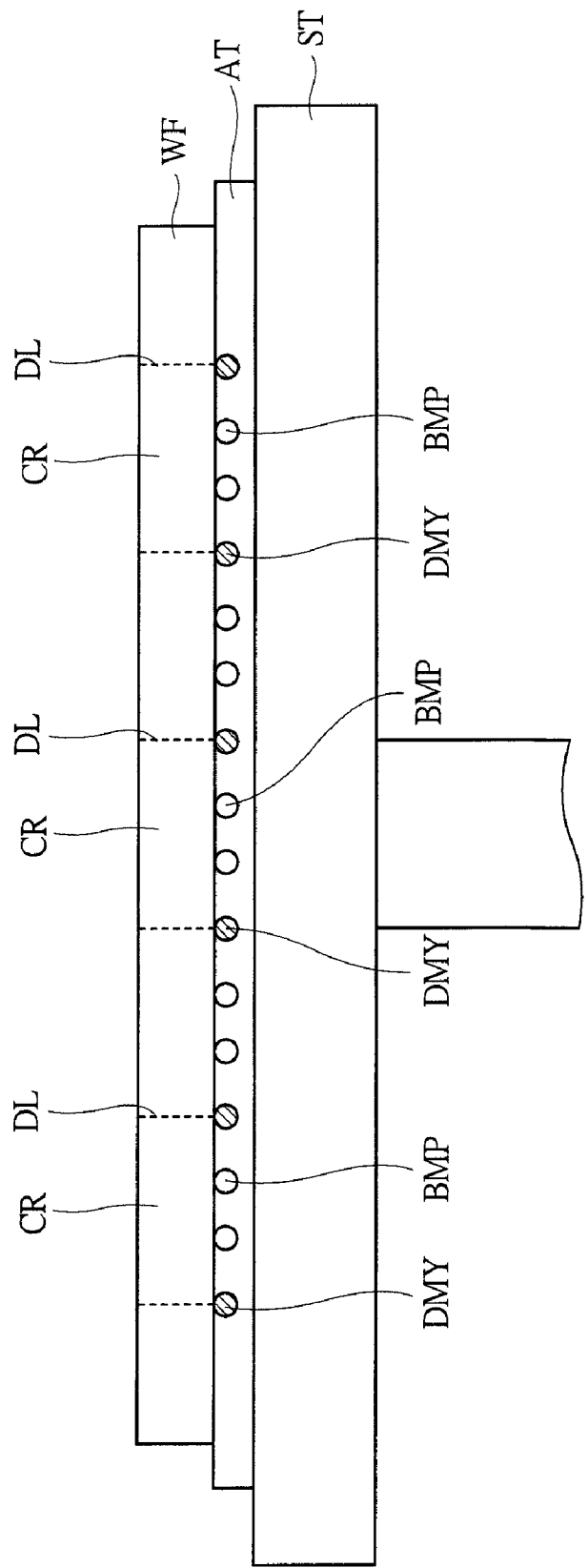
FIG. 46 is a cross-sectional view showing the manufacturing process of the semiconductor device in the fourth embodiment.

Subsequently, as shown in FIG. 46, the adhesive tape AT is attached onto the element forming surface of the semiconductor wafer WF. At this time, since the bump electrodes BMP are formed on the element forming surface of the semiconductor wafer WF, the adhesive tape AT is attached also to the bump electrodes BMP. Then, the semiconductor wafer WF is placed on the stage ST with the element forming surface of the semiconductor wafer WF being faced to the stage ST. More specifically, the semiconductor wafer WF is placed on the stage ST so that the element forming surface of the semiconductor wafer WF on which the bump electrodes BMP have been formed and the adhesive tape AT has been attached is adhered tightly to the stage ST. In this case, the rear surface of the semiconductor wafer WF is directed upward. At this time, as shown in FIG. 46, the plurality of chip regions CR partitioned by the dicing lines DL are formed in the semiconductor wafer WF, and the bump electrodes BMP are formed on the element forming surface of the chip regions. Also, the dummy bump electrodes DMY are formed on the dicing lines DL.

Figure 47:
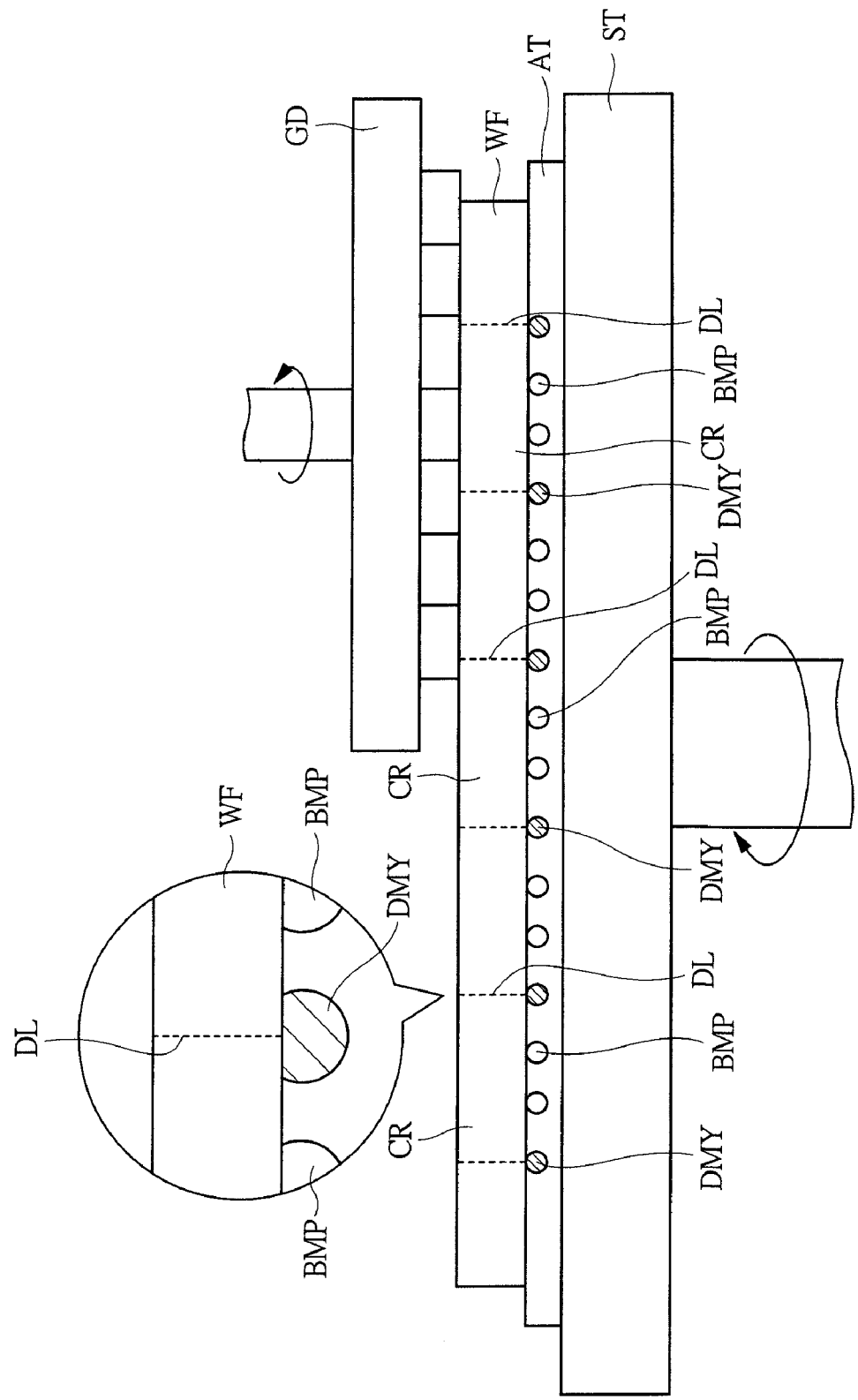
FIG. 47 is a cross-sectional view showing the manufacturing process of the semiconductor device continued from FIG. 46.

Next, as shown in FIG. 47, the grinder GD is pushed onto the rear surface of the semiconductor wafer WF directed upward to polish the rear surface of the semiconductor wafer WF. The thickness of the semiconductor wafer WF before the polishing is usually 500 μm to 700 μm. This semiconductor wafer WF is polished to a predetermined thickness (for example, 200 μm or less) while rotating both of the grinder GD and the stage ST (chuck table). At this time, in the fourth embodiment, in order that the bump density near the dicing line DL is made higher than the density of the bump electrodes BMP in the inner region (internal region) of the semiconductor chip CHP, the dummy bump electrodes DMY are formed on the dicing line DL. This is the effective means when there is not the sufficient space to form the dummy bump electrodes DMY away from the dicing line DL. By this means, the polishing pressure in the region near the dicing line in the polishing process of the semiconductor wafer WF can be increased, and the thickness of the semiconductor wafer WF on the dicing line DL can be made smaller than the thickness of the semiconductor wafer WF in the other inner region in which the bump electrodes BMP are formed. As a result, also in the fourth embodiment, the stress applied to the dicing line DL can be changed from the tensile stress to the compressive stress, and the occurrence of the cracks in the semiconductor wafer WF can be reduced. In other words, in the fourth embodiment, by forming the dummy bump electrodes DMY on the dicing line DL as described above, the trench DT in the region near the dicing line DL similar to that of the first embodiment can be formed.

Figure 48:
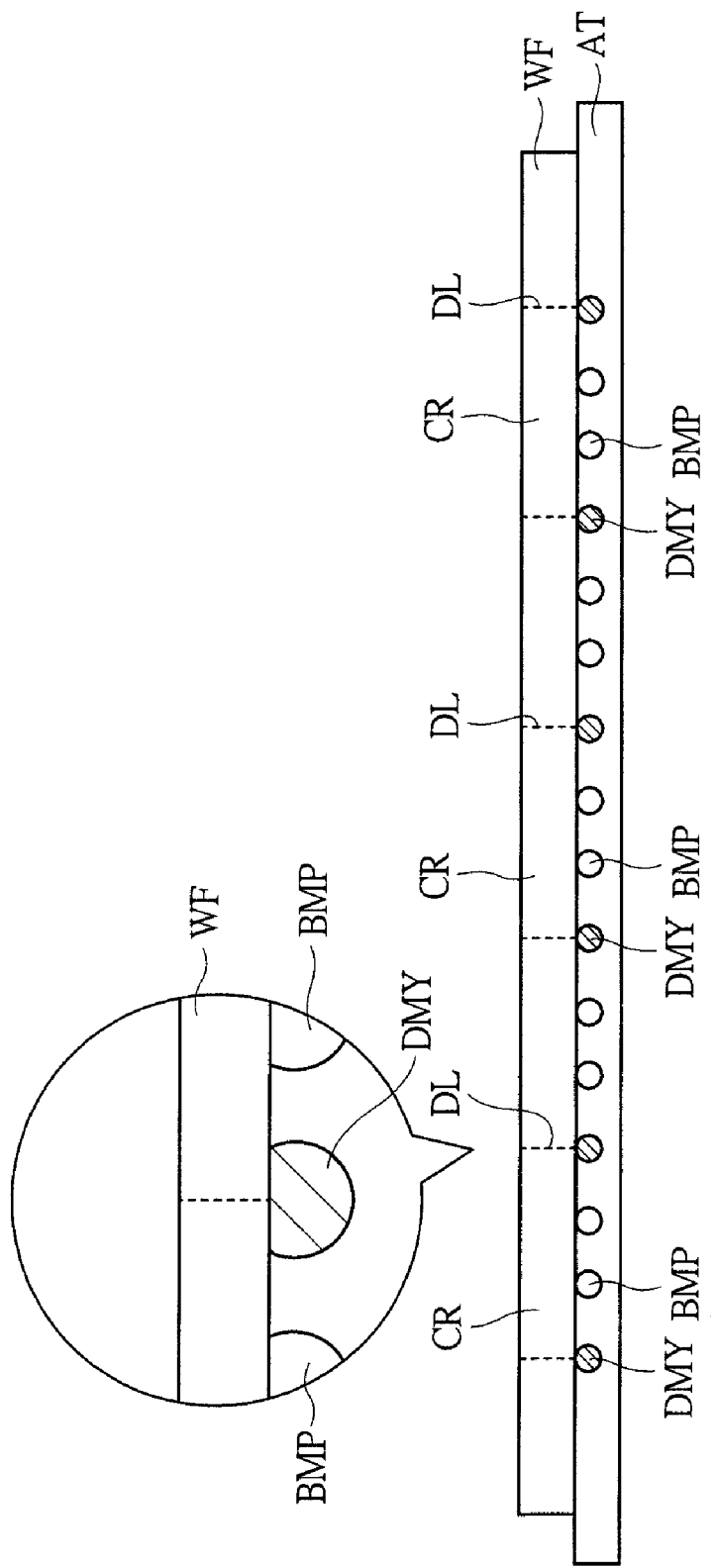
FIG. 48 is a cross-sectional view showing the manufacturing process of the semiconductor device continued from FIG. 47.

Thereafter, as shown in FIG. 48, the semiconductor wafer WF to which the adhesive tape AT has been attached is taken out from the stage ST. In this manner, the process of polishing the rear surface of the semiconductor wafer WF is completed. For example, by performing the process of polishing the rear surface of the semiconductor wafer WF, the thickness of the semiconductor wafer WF becomes 200 μm or less.

Figure 49:
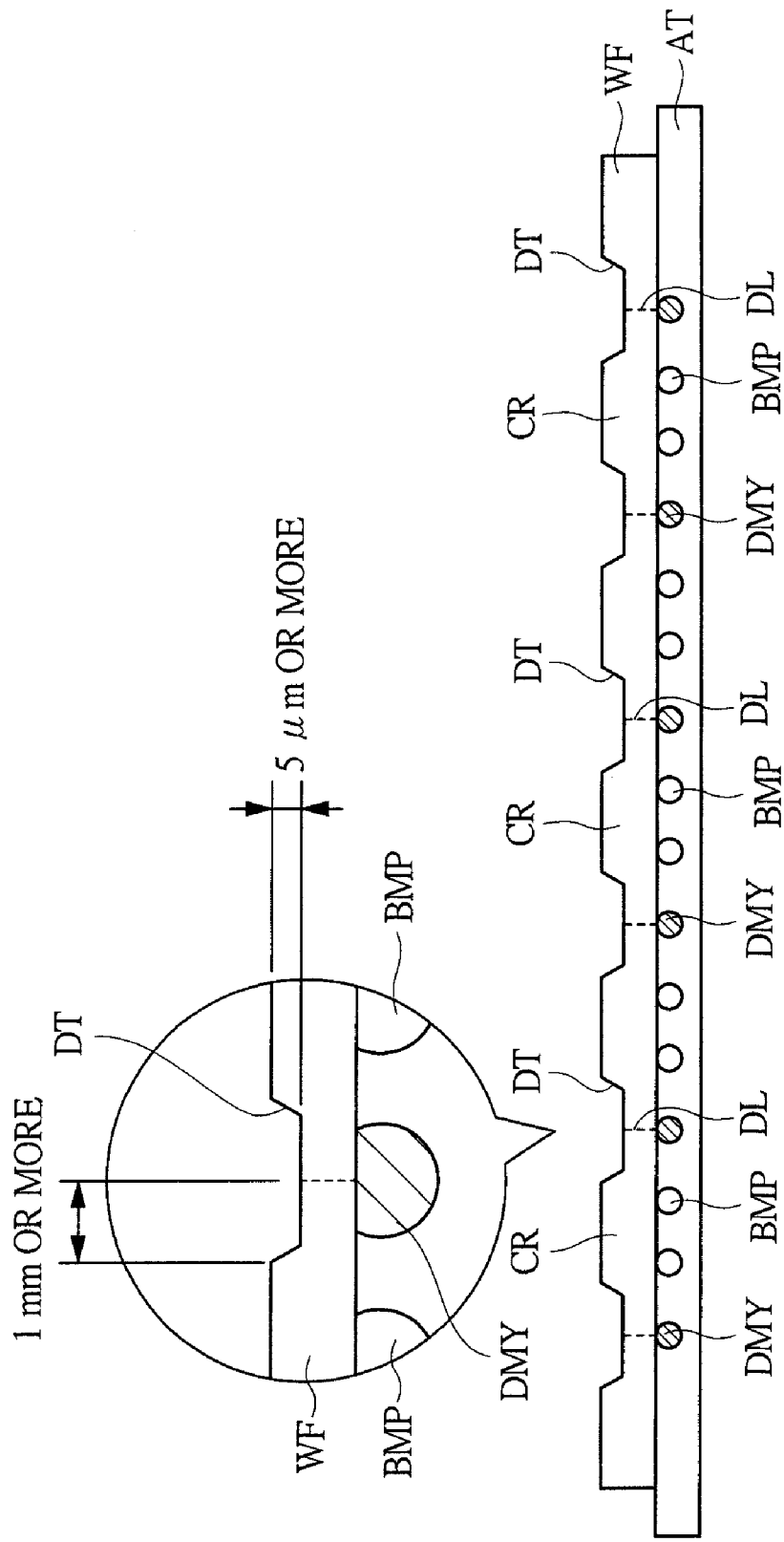
FIG. 49 is a cross-sectional view showing the manufacturing process of the semiconductor device continued from FIG. 48.

Here, in the fourth embodiment, the trench DT is formed over the region 1 mm or more from the dicing line DL in the rear surface of the semiconductor wafer WF so as to correspond to the position of the dicing line DL, and the depth of the trench DT is set to 5 μm or more as shown in FIG. 49.

Figure 50:
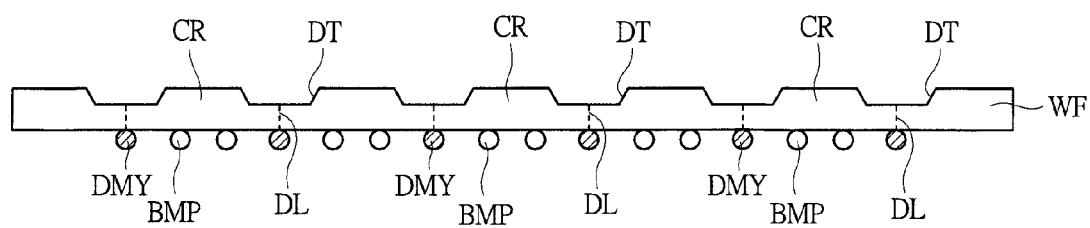
FIG. 50 is a cross-sectional view showing the manufacturing process of the semiconductor device continued from FIG. 49.

Thereafter, as shown in FIG. 50, the adhesive tape AT attached onto the element forming surface of the semiconductor wafer WF is removed as shown in FIG. 50. For example, when the adhesive tape AT is made of a material whose adhesive force is reduced by irradiating the ultraviolet, the adhesive tape AT is removed from the semiconductor wafer WF by irradiating the ultraviolet.

Figure 51:
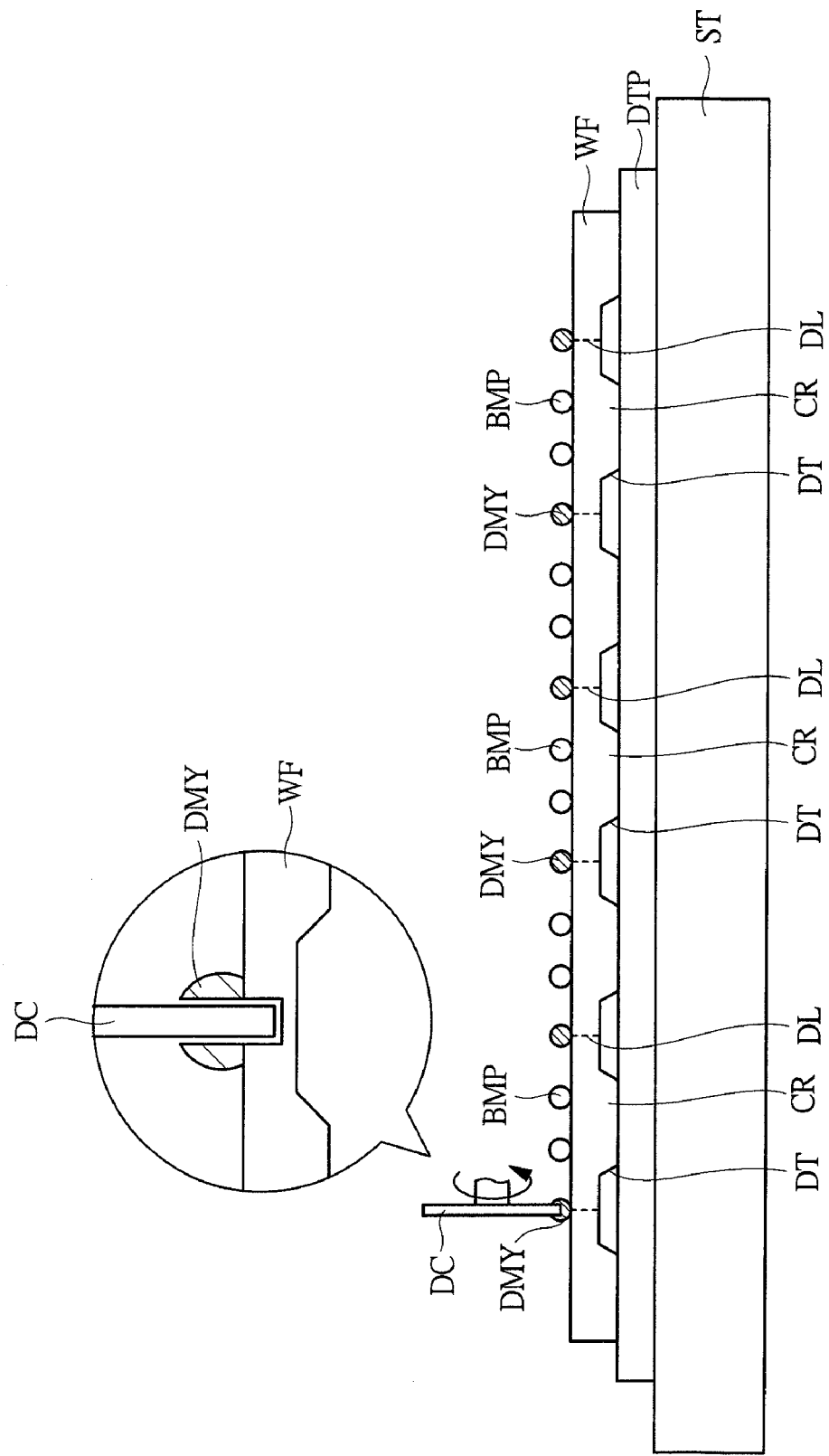
FIG. 51 is a cross-sectional view showing the manufacturing process of the semiconductor device continued from FIG. 50.

Subsequently, as shown in FIG. 51, by dicing the semiconductor wafer WF, the semiconductor wafer WF is cut into the individual pieces of the semiconductor chips. Specifically, as shown in FIG. 51, the dicing tape DTP is attached onto the rear surface of the semiconductor wafer WF, and the semiconductor wafer WF is fixed to the stage ST (chuck table) of the dicing apparatus. In other words, the rear surface of the semiconductor wafer WF to which the dicing tape DTP has been attached is faced to the stage ST, and the rear surface of the semiconductor wafer WF faced to the stage ST is fixed to the stage ST by the vacuum suction. In this manner, the main surface (element forming surface) of the semiconductor wafer WF on which the bump electrodes BMP are formed is directed upward. Then, the semiconductor wafer WF is cut by the dicing cutter DC along the dicing lines DL formed on the main surface (element forming surface) of the semiconductor wafer WF fixed to the stage ST. At this time, the dummy bump electrodes DMY formed on the dicing lines DL are also cut.

Figure 52:
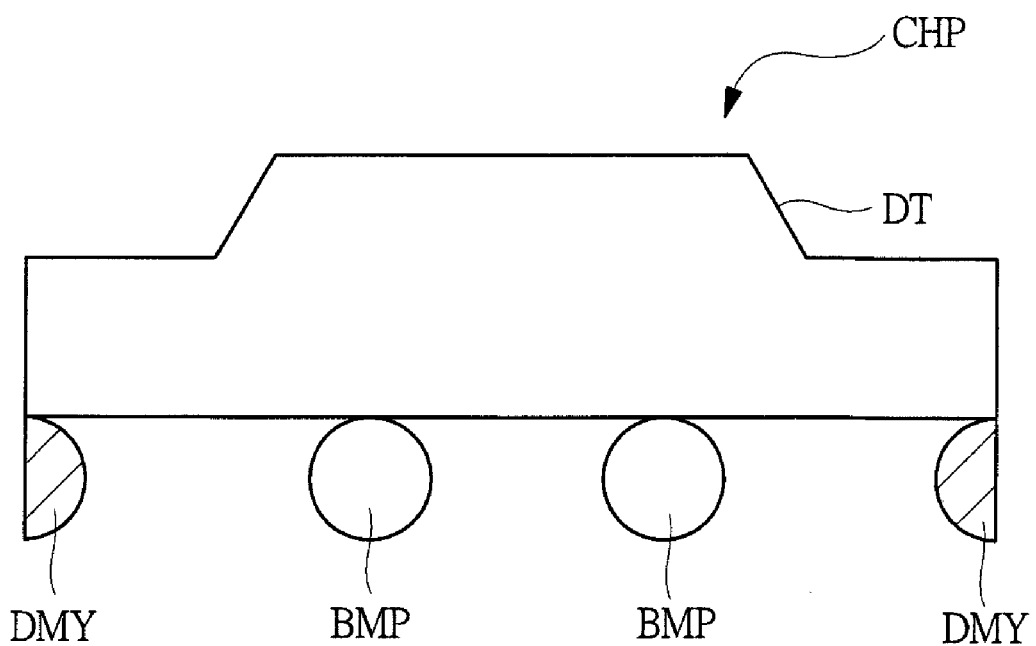
FIG. 52 is a cross-sectional view showing the semiconductor chip in the fourth embodiment.

By cutting the semiconductor wafer WF in the manner described above, the individual pieces of the semiconductor chips CHP can be obtained. FIG. 52 is a cross-sectional view showing the semiconductor chip CHP obtained by cutting the semiconductor wafer WF into pieces. As shown in FIG. 52, in the semiconductor chip CHP in the fourth embodiment, the bump electrodes BMP are formed on the element forming surface (lower surface in FIG. 52) of the semiconductor chip CHP, and the cut dummy bump electrodes DMY are formed at the edge portions of the semiconductor chip CHP. Further, the trenches DT are formed in the edge regions of the semiconductor chip CHP on the rear surface (upper surface in FIG. 52) of the semiconductor chip CHP.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is widely used in the manufacturing industry for manufacturing the semiconductor devices.

What is claimed is:

1. A semiconductor device comprising:
    a rectangular semiconductor chip,
        wherein the semiconductor chip includes:
        (a) a semiconductor substrate; and
        (b) a plurality of protruding bump electrodes formed on an element forming surface of the semiconductor substrate,
        wherein the semiconductor chip has an edge region and an inner region,
        wherein the protruding bump electrodes are formed in the inner region of the semiconductor chip in planar view and are formed on a top surface of the semiconductor substrate,
        wherein a trench is formed in the edge region of the semiconductor chip in a planar view and is formed on a rear surface of the semiconductor substrate, and
        wherein a thickness in the edge region of the semiconductor chip is smaller than a thickness in the inner region of the semiconductor chip.

2. The semiconductor device according to claim 1, wherein a remainder from the thickness in the edge region of the semiconductor chip to the thickness in the inner region of the semiconductor chip is a 5 μm or more.

3. The semiconductor device according to claim 1, wherein the thickness in the inner region of the semiconductor chip is 200 μm or less.

4. A semiconductor device comprising:
    a rectangular semiconductor chip,
    wherein the semiconductor chip includes:
    (a) a semiconductor substrate;
    (b) a semiconductor element formed on the semiconductor substrate;
    (c) a multilayer wiring formed on the semiconductor element;
    (d) a pad formed in a top layer of the multilayer wiring;
    (e) a resin film having an opening on the pad;
    (f) a rewiring filled in the opening to be electrically connected to the pad and extending on the resin film; and
    (g) a protruding bump electrode formed on one end of the rewiring which is electrically connected to the pad at the other end thereof,
    wherein the semiconductor chip has an edge region and an inner region,
    wherein the protruding bump electrodes are formed in the inner region of the individual chip region in planar view and are formed on a top surface of the semiconductor substrate,
    wherein a trench is formed in the edge region of the individual chip region in planar view and is formed on a rear surface of the semiconductor substrate, and
    wherein a thickness in the edge region of the semiconductor chip is smaller than a thickness in the inner region of the semiconductor chip.

5. A semiconductor wafer comprising:
    a plurality of chip regions partitioned by dicing lines,
    wherein each of the plurality of chip regions includes:
    (a) a semiconductor substrate; and
    (b) a plurality of protruding bump electrodes formed on an element forming surface of the semiconductor substrate,
    wherein each of the plurality of chip regions has an edge region and an inner region, wherein the protruding bump electrodes are formed in the inner region of the individual chip region in planar view and are formed on a top surface of the semiconductor substrate, wherein a trench is formed in the edge region of the individual chip region in planar view and is formed on a rear surface of the semiconductor substrate, and wherein a thickness in the edge region of the individual chip region is smaller than a thickness in the inner region of the individual chip region.

6. The semiconductor wafer according to claim 5, wherein a remainder from the thickness in the edge region of the individual chip region to the thickness in the inner region of the individual chip region is 5 µm or more.

7. The semiconductor wafer according to claim 5, wherein the thickness in the inner region of the individual chip region is 200 µm or less.

8. A semiconductor wafer comprising:
a plurality of chip regions partitioned by dicing lines, each of the plurality of chip regions including:
(a) a semiconductor substrate;
(b) a semiconductor element formed on the semiconductor substrate;
(c) a multilayer wiring formed on the semiconductor element;
(d) a pad formed in a top layer of the multilayer wiring;
(e) a resin film having an opening on the pad;
(f) a rewiring filled in the opening to be electrically connected to the pad and extending on the resin film; and
(g) a protruding bump electrode formed on one end of the rewiring which is electrically connected to the pad at the other end thereof, and each of the plurality of chip regions having an edge region and an inner region, wherein the protruding bump electrodes are formed in the inner region of the individual chip region in planar view and are formed on a top surface of the semiconductor substrate, wherein a trench is formed in the edge region of the individual chip region in planar view and is formed on a rear surface of the semiconductor substrate, and wherein a thickness in the edge region of the individual chip region is smaller than a thickness in the inner region of the individual chip region.

* * * * *